(12) United States Patent
Onishi et al.

(10) Patent No.: US 6,814,804 B2
(45) Date of Patent: Nov. 9, 2004

(54) APPARATUS AND METHOD FOR PRINTING SOLDER PASTE

(75) Inventors: Hiroaki Onishi, Higashiosaka (JP); Shoji Sato, Neyagawa (JP); Takao Naito, Yamanashi-ken (JP); Takaaki Higashida, Kadoma (JP); Akira Kabeshita, Hirakata (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 10/119,940

(22) Filed: Apr. 11, 2002

(65) Prior Publication Data

US 2002/0108513 A1 Aug. 15, 2002

Related U.S. Application Data

(62) Division of application No. 08/987,202, filed on Dec. 9, 1997, now Pat. No. 6,395,335.

(30) Foreign Application Priority Data

Dec. 10, 1996 (JP) .............................................. 8-329758
May 26, 1997 (JP) .............................................. 9-134778

(51) Int. Cl.[7] .............................................. B05C 11/02
(52) U.S. Cl. ........................ 118/213; 118/406; 118/504; 118/505; 101/129; 228/39
(58) Field of Search ................................. 118/213, 301, 118/406, 504, 505; 101/129; 427/356, 357, 367; 228/39

(56) References Cited

U.S. PATENT DOCUMENTS

| 4,937,097 A | 6/1990 | Ichinose et al. ............. 427/282 |
| 5,044,306 A | 9/1991 | Erdmann ...................... 427/96 |
| 5,047,262 A | 9/1991 | De Vries et al. .............. 427/96 |
| 5,052,291 A | 10/1991 | Takahashi et al. ........... 101/129 |
| 5,232,651 A | 8/1993 | Okuno et al. ................ 264/251 |
| 5,309,837 A | 5/1994 | Nanzai ........................ 101/129 |
| 5,452,655 A | 9/1995 | Tani ............................ 101/126 |
| 5,478,700 A | 12/1995 | Gaynes et al. ................ 427/96 |
| 5,479,854 A | 1/1996 | Chikahisa et al. .......... 101/123 |
| 5,483,884 A | 1/1996 | Vellanki ...................... 101/126 |
| 5,493,969 A | 2/1996 | Takahashi et al. .......... 101/129 |
| 5,553,538 A | 9/1996 | Freitag ........................ 101/126 |
| 5,553,540 A | 9/1996 | Tani ............................ 101/126 |
| 5,746,127 A | 5/1998 | Fischbeck et al. .......... 101/129 |
| 5,868,302 A | 2/1999 | Onishi ......................... 427/282 |
| 5,871,807 A | 2/1999 | Stansbury ................... 427/282 |

FOREIGN PATENT DOCUMENTS

| EP | 0 071 014 | 2/1983 |
| JP | 01-171944 | 7/1989 |
| JP | 05-337425 | 12/1993 |
| JP | 06-155708 | 6/1994 |
| JP | 06238869 | 8/1994 |
| JP | 08197712 | 8/1996 |

OTHER PUBLICATIONS

English Language Abstract of Japanese Patent application No. 08 197712 A, Aug. 6, 1996.
English Language Abstract of Japanese Patent application No. 04 185340 A, Jul. 2, 1992.

(List continued on next page.)

Primary Examiner—Laura Edwards
(74) Attorney, Agent, or Firm—Wenderoth, Lind & Ponack, L.L.P.

(57) ABSTRACT

A filling squeegee and a scraping squeegee are provided in a printing apparatus. The filling squeegee is moved without contacting a surface of a mask in order to fill a solder paste into openings of the mask. Unnecessary solder paste on the surface of the mask is scraped by the scraping squeegee. The solder paste is prevented from being improperly filled in or scraped from the openings even if a speed of the squeegee is increased, so that the solder paste can be printed stably on circuit board.

15 Claims, 18 Drawing Sheets

OTHER PUBLICATIONS

English Language Abstract of Japanese Patent application No. 03 233994 A, Oct. 17, 1991.

English Language Abstract of Japanese Patent application No. 58 090981, May 30, 1983.

English Language Abstract of Japanese Patent application No. 05 175646 A, Oct. 22, 1993.

English Language Abstract of Japanese Patent application No. 08 025610, Jan. 30, 1996.

English Language Abstract of Japanese Patent application No. 08 132588 A, May 28, 1996.

English Language Abstract of Japanese Patent application No. 06 238869 A, Aug. 30, 1994.

APPARATUS AND METHOD FOR PRINTING SOLDER PASTE

This application is a Divisional application of Ser. No. 08/987,202, filed Dec. 9, 1997, now U.S. Pat. No. 6,395,335.

BACKGROUND OF THE INVENTION

The present invention relates to an apparatus and a method for printing and applying solder paste onto surfaces of circuit boards.

In the prior art of manufacturing electronic circuit boards, solder paste has been primarily used to solder electronic components such as chips or the like onto printed boards. A solder paste printing apparatus has been employed to print and apply the solder paste in a required pattern.

A squeegee head loaded onto a conventional solder paste printing apparatus 100 is shown in FIG. 20. Generally, a squeegee head 102 moves from left to right and from right to left in FIG. 20, alternately for each printed board 5, to print the solder paste. A right squeegee 101*a* is used for printing in the right direction, namely, from left to right in FIG. 20, and a left squeegee 101*b* is used for printing in the opposite left direction.

Operation of the conventional solder paste printing apparatus 100 will be described with reference to FIGS. 20–22. In FIGS. 20–22, reference numbers respectively indicate: 3 a mask having openings 4 formed in a required pattern; 5 a printed board; 6 a land to which a solder paste 7 is printed; and 8 a solder resist. The above-mentioned required pattern of the mask 3 is a pattern in which the openings 4 are formed corresponding to the lands 6 on the printed board 5.

Firstly, during printing in the right direction, the printed board 5 is positioned and overlapped with the mask 3 so that the openings 4 align with the lands 6. Thereafter, while the left squeegee 101*b* is kept raised, the right squeegee 101*a* is lowered to bring a squeegee front end part 103 in touch (contact) with a surface 3*a* of the mask 3 with a suitable printing pressure. In this state, the right squeegee 101*a* is linearly moved in the right direction to thereby fill the solder paste 7 provided at the surface 3*a* of the mask 3 into the openings 4 of the mask 3. The printed board 5 is separated from the mask 3 after the right squeegee 101*a* is moved to the right end of the mask 3, when the printing is finished. Meanwhile, in the case of printing in the left direction, the printed board 5 is positioned and overlapped with the mask 3, which is similar to printing in the right direction. Then, the left squeegee 101*b* is lowered, while the right squeegee 101*a* is held up, to bring the squeegee front end part 103 in touch with the mask 3. The operation afterwards is the same as in the case of printing in the right direction. By repeating the operations in the right direction and left direction alternately for every printed board 5, the solder paste 7 is continuously printed and applied onto the lands 6 of every printed board 5 via the mask 3.

the conventional solder paste printing apparatus 100, the squeegee 101*a* or 101*b* is moved while the front end part 103 of the squeegee is kept in touch with the surface 3*a* of the mask 3 with a suitable printing pressure. Each of the conventional squeegees 101*a*, 101*b* executes two kinds of operations (i.e., a scraping operation of scraping the solder paste 7 at the surface 3*a* of the mask 3 and a filling operation of filling the solder paste 7 into the openings 4 of the mask 3). These operations will be described with reference to FIGS. 21 and 22.

FIGS. 21 and 22 are enlarged views of the printing squeegee 101*a*, etc. when the printing is carried out in the right direction. As shown in FIG. 21, when the right squeegee 101*a* is lowered to bring the front end part 103 in touch with the surface 3*a* of the mask 3 and moved linearly in the right direction, the right squeegee 101*a*, which touches the solder paste 7 fed onto the surface 3*a* of the mask 3, moves while scraping the solder paste 7. The scraped solder paste 7 flows in a rotary direction called rolling as indicated by an arrow I in FIG. 22. At this time, a fluid pressure is generated inside the solder paste 7. When the right squeegee 101*a* moves further right to reach the opening 4 of the mask 3 in the above condition, the solder paste 7 is pressed into the openings 4 because of the above-described fluid pressure. In other words, the solder paste 7 is filled in the openings 4. A pressure with which the solder paste 7 is pressed into the openings 4 will be denoted as a "filling pressure" hereinbelow.

A coordinate system is shown in FIG. 23 with the printing squeegee 101*a*. A viscosity of the solder paste 7 is η. An angle of the surface 3*a* of the mask 104 of the printing squeegee 101*a* facing the surface 3*a* (referred to as a "squeegee angle" hereinafter) is α. A speed of the moving squeegee 101*a* (referred to as a "squeegee speed") is v. It is known that a fluid pressure p produced inside the solder paste 7 is expressed by an equation below:

$$p=(2\theta v/r)*(A \sin \theta + B \cos \theta) \tag{1}$$

wherein r is a radial position in a polar coordinate system of FIG. 23, θ is an angle of the surface 3*a* of the mask 3 to the above r, $A=\sin^2\alpha/(\alpha^2-\sin^2\alpha)$ and $B=(\alpha-\sin\alpha*\cos\alpha)/(\alpha^2-\sin^2\alpha)$.

From the above expression (1), a fluid pressure distribution in the solder paste 7 and a pressure distribution at the face 104 of the printing squeegee 101*a* are as indicated in FIG. 24. Specifically, a shaded part 105 in FIG. 24 is where the fluid pressure p (adequate filling pressure) is generated.

Print time in the printing process is reduced in order to improve productivity. However, if the squeegee speed v is made faster in order to shorten the print time in the conventional solder paste printing apparatus 100, the amount of the solder paste 7 filled in the openings 4 of the mask 3 becomes less as indicated in FIG. 25. This results in printing failures such as non-filled parts 9 (unfilled parts) and hinders stable printing. The non-filled parts 9 are not generally brought about, for example, if ink is used for screen printing, but are created when a paste-like substance of a mixture of a high viscosity flux with powder solder (e.g., the solder paste 7 or the like is used). The non-filled parts 9 are caused by using the powder solder. In other words, it is impossible to realize a reduction of the print time through an increase of the squeegee speed v in the conventional solder paste printing apparatus 100.

How the non-filled part 9 results from an increase of the squeegee speed v is described as follows. When the squeegee speed v is increased (more than in the prior art), a time for the front end part 103 of the printing squeegee 101*a* to pass over the opening 4 is reduced. Consequently, a time for the solder paste 7 to be filled in the opening 4 (referred to as a "fill time") is naturally shortened. The filling pressure becomes maximum when r=0 ( i.e., at a contact point between the front end part 103 of the printing squeegee 101*a* and the surface 3*a* of the mask 3), as is understood from the expression (1) and FIGS. 23 and 24. Although $P_r=p_\theta=\infty$ is theoretically held when r=0, the contact point is practically a stagnation point and accordingly is at a maximum value.

While the filling pressure itself is raised when the squeegee speed v is increased, a high pressure range is narrow as is seen from the pressure distribution of the shaded part 105 of FIG. 24. In addition, since the front end part 103 passes over the opening 4 instantaneously, the fill time cannot be long enough. As a result of this, the non-filled part 9 is formed.

In order to prevent an occurrence of the non-filled part 9, from the expression (1), it can be considered that the squeegee angle α should be reduced and at the same time the filling pressure should be increased, whereby the filling is completed even with a short fill time. However, since the conventional printing squeegee 101a performs two operations, namely, the filling operation of the solder paste 7 and the scraping operation from the surface 3a of the mask 3 as described above, the front end part 103 is largely deformed if the filling pressure is increased, which makes it impossible to scrape the solder paste 7 from the surface 3a of the mask 3. The solder paste 7 is left on the surface 3a of the mask 3, as shown in FIG. 26. In the event that the front end part 103 of the squeegee 101a further tightly presses the surface 3a of the mask 3 so as to prevent the solder paste 7 from remaining at the surface 3a of the mask 3, as shown in FIG. 27, the solder paste 7 is actually scraped, and the amount of the deformation of the front end part 103 of the squeegee is increased due to the larger contact pressure. Therefore, when the front end part 103 reaches the opening 4, a part of the front end part 103 enters the opening 4 subsequent to the restoration of the front end part 103, and undesirably scrapes the solder paste 7 already filled in the opening 4. Moreover, the powder solder included in the solder paste 7 facilitates the scraping. The amount of the solder paste 7 filled in the opening 4 is hence decreased and stable printing is prevented.

Under these circumstances, when printing is conventionally performed, a worker sets, adjusts and changes printing conditions based on experiments in order to fully achieve both the scraping operation and the filling operation so that the solder is printed paste stably. In other words, the printing conditions are set, adjusted and changed with a great deal of personal differences between workers, and maintenance of stable printing is difficult.

SUMMARY OF THE INVENTION

The present invention is devised to solve the above-described inconveniences, and an object of the present invention is to provide a solder paste printing apparatus and a solder paste printing method whereby a solder paste can be printed stably even when print time is increased as compared with the prior art.

In accomplishing this and other objects, according to a first aspect of the present invention, there is provided a solder paste printing apparatus wherein a squeegee device moves in a printing direction along a surface of a mask having openings formed therein, to thereby print and apply solder paste on the surface via the openings to a face of a circuit board positioned at a rear face of the mask, the squeegee device comprising: a filling squeegee having a front end kept in a noncontact state via a gap between the surface and the filling squeegee at the time of printing, and filling the solder paste into the openings while moving in the printing direction; and a scraping squeegee arranged behind the filling squeegee in the printing direction, moving in the same direction as the filling squeegee while keeping in touch with the surface at the time of printing thereby removing unnecessary solder paste on the surface.

According to a second aspect of the present invention, there is provided a solder paste printing apparatus according to the first aspect, wherein the scraping squeegee is provided for each direction behind the filling squeegee with respect to the printing direction in a case where the squeegee reciprocates relative to the surface of the mask.

According to a third aspect of the present invention, there is provided a solder paste printing apparatus according to the second aspect, wherein the filling squeegee is divided into two squeegees, one for each printing direction.

According to a fourth aspect of the present invention, there is provided a solder paste printing apparatus according to any one of the first to third aspects, further comprising an angle setting device for setting the scraping squeegee so that an angle of the squeegee in an axial direction thereof relative to the surface of the mask is optionally set to acute or obtuse angle.

According to a fifth aspect of the present invention, there is provided a solder paste printing apparatus according to the fourth aspect, wherein the scraping squeegee is inclined at the obtuse angle by the angle setting device.

According to a sixth aspect of the present invention, there is provided a solder paste printing apparatus according to the fourth aspect, wherein the scraping squeegee is inclined with the acute angle by the angle setting device thereby filling the solder paste into the openings as well as removing the unnecessary solder paste.

According to a seventh aspect of the present invention, there is provided a solder paste printing apparatus according to any one of the first to sixth aspects, wherein the scraping squeegee is disposed so that an extending direction of a line of contact between the scraping squeegee and the surface of the mask intersects with an extending direction of a side edge part defining one of the openings.

According to an eighth aspect of the present invention, there is provided a solder paste printing apparatus according to any one of the first to seventh aspects, wherein a face of the filling squeegee opposite to the surface of the mask forms a filling pressure face which is inclined upward from the front end in the printing direction so as to press the solder paste onto the surface and fill the solder paste into the openings.

According to a ninth aspect of the present invention, there is provided a solder paste printing apparatus according to the eighth aspect, further comprising a filling adjustment device for adjusting filling of the solder paste into the openings by varying at least one of a size of the gap and an intersection angle between the filling pressure face and the surface.

According to a tenth aspect of the present invention, there is provided a solder paste printing apparatus according to the ninth aspect, further comprising a filling pressure detector for detecting a change of a filling pressure of the solder paste filled into the openings at the time of printing, and a control device for controlling the filling adjustment device based on the filling pressure detected by the filling pressure detector.

According to an eleventh aspect of the present invention, there is provided a solder paste printing apparatus according to the tenth aspect, wherein the filling pressure detector is a reaction force detector for detecting a reaction force which is a sum of the filling pressures of the solder paste acting on the whole filling pressure face at the time of printing.

According to a twelfth aspect of the present invention, there is provided a solder paste printing apparatus according to the tenth aspect, wherein the filling pressure detector is a pressure detector set at the filling pressure face for detecting the filling pressure of the solder paste directly.

According to a thirteenth aspect of the present invention, there is provided a solder paste printing method comprising: moving a filling squeegee in a printing direction during printing while keeping a front end of the filling squeegee in a noncontact state via a gap between the filling squeegee and a surface of a mask having openings formed therein, thereby filling a solder paste on the surface to the openings; and removing unnecessary solder paste on the surface by a scraping squeegee moving in touch with the surface in the printing direction.

According to a fourteenth aspect of the present invention, there is provided a solder paste printing method according to the thirteenth aspect, wherein the scraping squeegee is set so that an angle of the scraping squeegee in an axial direction thereof relative to the surface of the mask is optionally an acute or obtuse angle.

According to the fifteenth aspect of the present invention, there is provided a solder paste printing method according to the fourteenth aspect, wherein, when the scraping squeegee is set to the obtuse angle, the scraping squeegee removes the unnecessary solder paste without adversely influencing the solder paste filled in the openings.

According to a sixteenth aspect of the present invention, there is provided a solder paste printing method according to the fourteenth aspect, wherein, when the scraping squeegee is set to the acute angle, the scraping squeegee fills the solder paste to the openings as well as removes the unnecessary solder paste.

According to a seventeenth aspect of the present invention, there is provided a solder paste printing method according to any one of the thirteenth to sixteenth aspects, wherein the scraping squeegee is set so that an extending direction of a line of contact between the scraping squeegee and the surface of the mask intersects with an extending direction of a side edge part defining one of the openings.

According to an eighteenth aspect of the present invention, there is provided a solder paste printing method according to any one of the thirteenth to seventeenth aspects, wherein a face of the filling squeegee opposite to the surface of the mask forms a filling pressure face which is inclined upward from the front end in the printing direction so as to press the solder paste to the surface and fill the solder paste into the openings.

According to a nineteenth aspect of the present invention, there is provided a solder paste printing method according to the tenth aspect, wherein a change of a filling pressure of the solder paste when the solder paste is filled by the filling squeegee into the openings at the time of printing is detected by a filling pressure detector, and at least one of an intersection angle between the filling pressure face and the surface, and a size of the gap is adjusted based on the detected filling pressure, to thereby change printing conditions.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
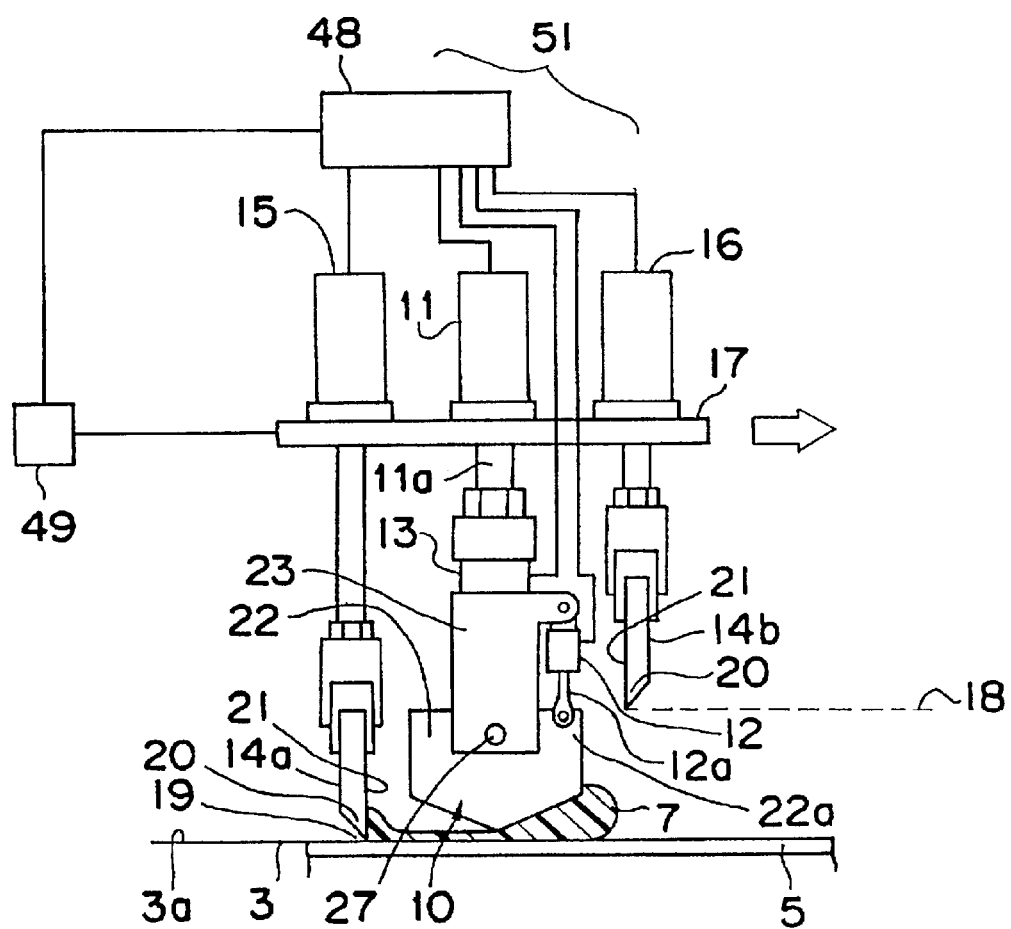
FIG. 1 is a diagram showing a solder paste printing apparatus according to one embodiment of the present invention.

Before the present invention is described, it is to be noted that like parts are designated by like reference numerals throughout the accompanying drawings.

An apparatus and a method for printing a solder paste according to one embodiment of the present invention will be described with reference to the drawings. The printing method is carried out by the printing apparatus. Parts functioning the same or similarly are designated by the same reference numerals throughout the drawings, the description of which will be omitted. A solder paste is a paste-like solder obtained by mixing powder solder with a high viscosity flux. An up-down driving device 11 and an angle variable device 12 for a filling squeegee 10, which will be described later, constitute a filling adjustment device. A reaction force detector 13 and pressure detectors 532a, 532b, which will be described later, correspond to an embodiment achieving the function of a filling pressure detector.

FIG. 1 is a schematic diagram in the neighborhood of squeegees in a solder paste printing apparatus 51 of the embodiment. The squeegees move both in the right and in the left directions in the solder paste printing apparatus 51.

In addition to a scraping squeegee 14a for use in printing in the right direction and a scraping squeegee 14b for use in printing in the left direction, the solder paste printing apparatus 51 has the filling squeegee 10 arranged at a position between the squeegees 14a and 14b (in a printing direction) for filling a solder paste 7 into openings 4 of a mask 3.

Figure 11:
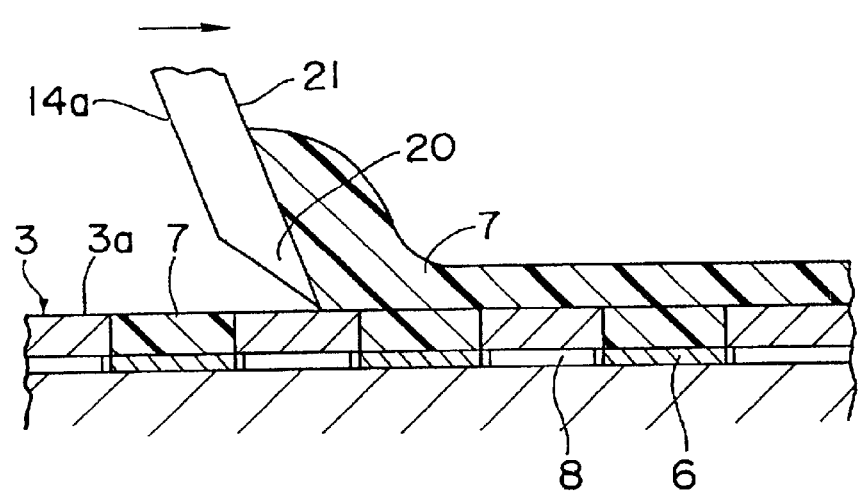
FIG. 11 is a diagram of a state when the solder paste is scraped while a side face of the scraping squeegee is set at an obtuse angle to a surface of the mask in the solder paste printing apparatus of FIG. 9.
Figure 13:
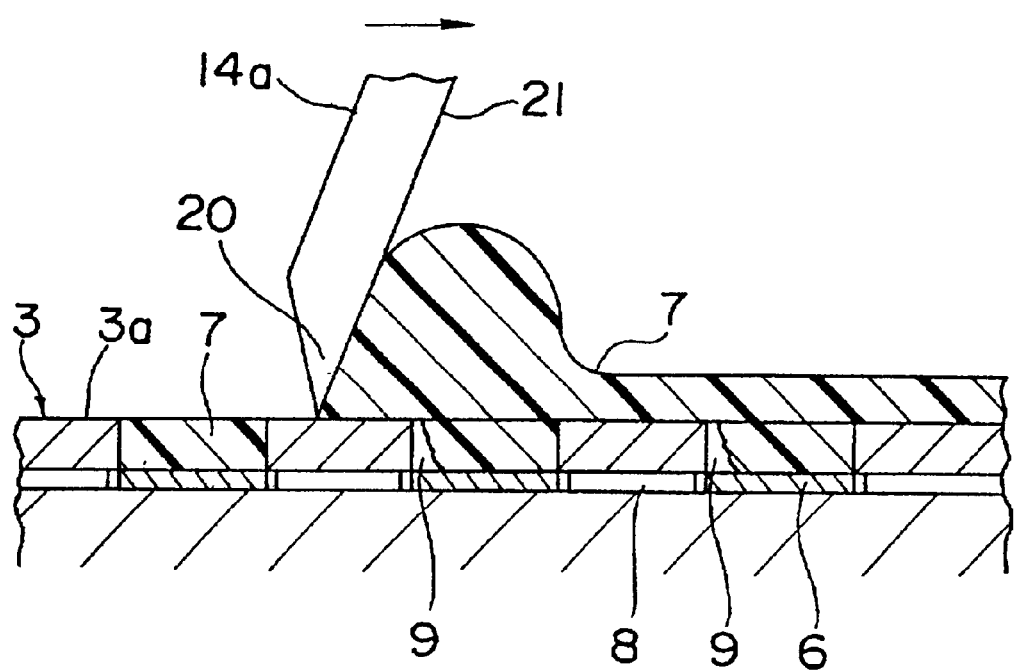
FIG. 13 is a diagram of a state when the solder paste is filled in the openings while a side face of the scraping squeegee is set at an acute angle to the surface of the mask in the solder paste printing apparatus of FIG. 9.

Each of the scraping squeegees 14a, 14b, which scrapes unnecessary solder paste 7 off the mask 3 at the time of printing, is moved up and down between a standby position 18 and a scrape position 19 by an up-down driving device 15, 16 mounted to a squeegee head bed plate 17 of the printing apparatus 51. The bed plate 17 is moved in the left and right printing directions by a driving device 49 controlled by a control device 48. FIG. 1 shows a state when the printing is conducted in the right direction. The scraping squeegee 14a is lowered to the scrape position 19, while the scraping squeegee 14b is raised to the standby position 18. When the scraping squeegee 14a, 14b is at the scrape position 19, a front end part 20 (tip end part) of each squeegee comes into contact with a surface 3a of the mask 3 so that a suitable pressure is impressed to the surface 3a. Although a side face (pushing face) 21 of the front end part 20 of each of the scraping squeegees 14a, 14b extends orthogonally to the surface 3a in FIG. 1, the side face 21 of each of the squeegees 14a, 14b is inclined during printing with an optional acute or obtuse angle to the surface 3a of the mask 3 (for example, as shown in FIGS. 11 and 13) in order to scrape unnecessary solder paste 7 off the surface 3a. The unnecessary solder paste 7 on the surface 3a is a solder paste that swells over the surface 3a and openings 4 of the mask 3.

The driving device 49 and up-down driving devices 15, 16 are respectively connected to the control device 48, which controls the operation of the solder paste printing apparatus 51. The filling squeegee 10 has a filling member 22 and a holding member 23 that holds the filling member 22. The filling squeegee 10 is coupled via the reaction force detector 13 to a driving shaft 11a of an up-down driving device 11 in order to be mounted to the bed plate 17. The up-down driving device 11 is connected to the control device 48 and driven via the control device 48 based on output information from the reaction force detector 13 in order to move the driving shaft 11a up and down (as will be described in detail below).

Figure 2:
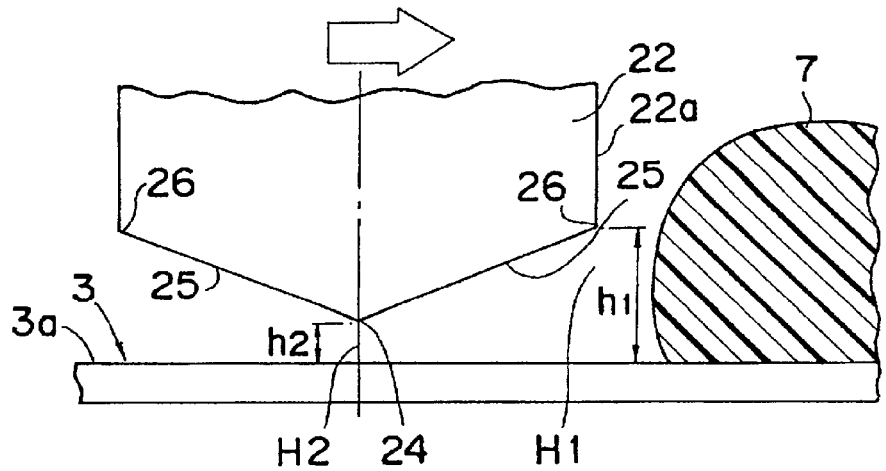
FIG. 2 is a diagram of a front end part of a filling member of a filling squeegee of FIG. 1.

In one embodiment, a single filling squeegee 10 is provided for both the right and left printing directions. The filling member 22 is formed in the shape of a bottom of a ship as shown in FIG. 2. A face at a front end part of the filling member 22, which opposes the surface 3a, constitutes (as is illustrated in a detailed manner in FIG. 2) a filling pressure face 25 inclined upward from a tip end 24 of the filling member 22 in each printing direction. The filling member 22 can be formed of rubber, metal or the like material used in conventional squeegees. During printing the filling squeegee 10 is arranged so that the tip end 24 forms a gap H2 with a size (distance) h2 to the surface 3a, and moreover, an edge portion 26 between a side face 22a at the side of the printing direction of the filling member 22 and the filling pressure face 25 forms a gap H1 with a size h1 (distance) to the surface 3a.

Since the filling squeegee 10 with the above-described filling member 22 and the scraping squeegees 14a, 14b is provided in the apparatus, a part 9 is never left unfilled with the solder paste 7 in the openings 4 of the mask 3. Unlike the conventional apparatus even when a squeegee speed of the filling squeegee 10 is increased, stable printing is still achieved. The reasons for this will be described below.

Figure 3:
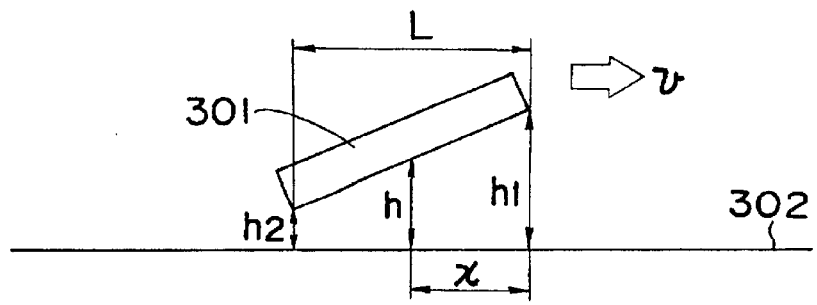
FIG. 3 is a diagram of a model for obtaining a filling pressure of solder paste by the filling member of the filling squeegee of FIG. 1.
Figure 4:
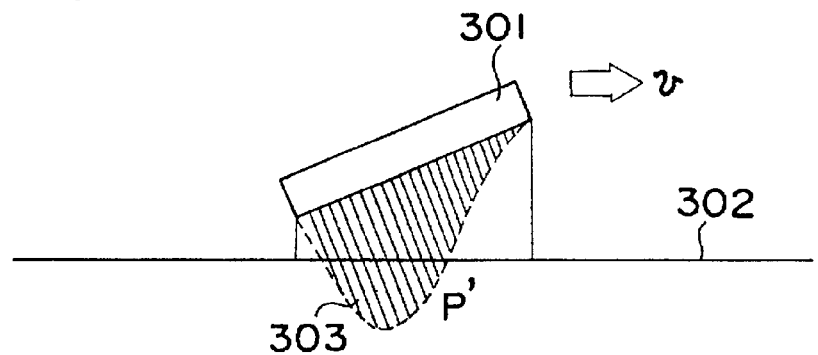
FIG. 4 is a diagram of a pressure distribution obtained from the model of FIG. 3.

The filling pressure generated when the solder paste 7 is filled in the openings 4 by the filling squeegee 10 will be depicted with reference to FIG. 2. In the state shown in FIG. 2, when the filling squeegee 10 is moved right as indicated by an arrow, the solder paste 7 enters from the side of the gap H1 of the filling pressure face 25 of the filling member 22 and flows out of the gap H2. This phenomenon can be explained by an example of flow of a substance entering a narrow wedge-like gap. Specifically, a model shown in FIG. 3 is used here to depict the phenomenon. The model is a generally known one used in the description of fluid lubrication of a bearings or the like and is similar to the filling member 22 of the right half from gap H2 to the gap H1. In FIG. 3, assuming that a size of a gap at the entrance side of a fluid between a wall body 301 and a reference face 302 is h1, a size of the gap at the exit side is h2, a distance between the entrance and exit gaps is L, a size of a gap between the wall body 301 and reference face 302 at a distance x from the entrance gap is h, a speed of the moving wall body 301 is v, and a viscosity of the fluid is η, a pressure p' generated due to flow of the fluid at the distance x is expressed by the following equation. A distribution of the pressure p' is as shown in FIG. 4 and is well known.

$$p' = (6\eta v L/(h_1^2 - h_2^2)) * ((h_1 - h)(h - h_2)/h^2) \qquad (2)$$

Figure 24:
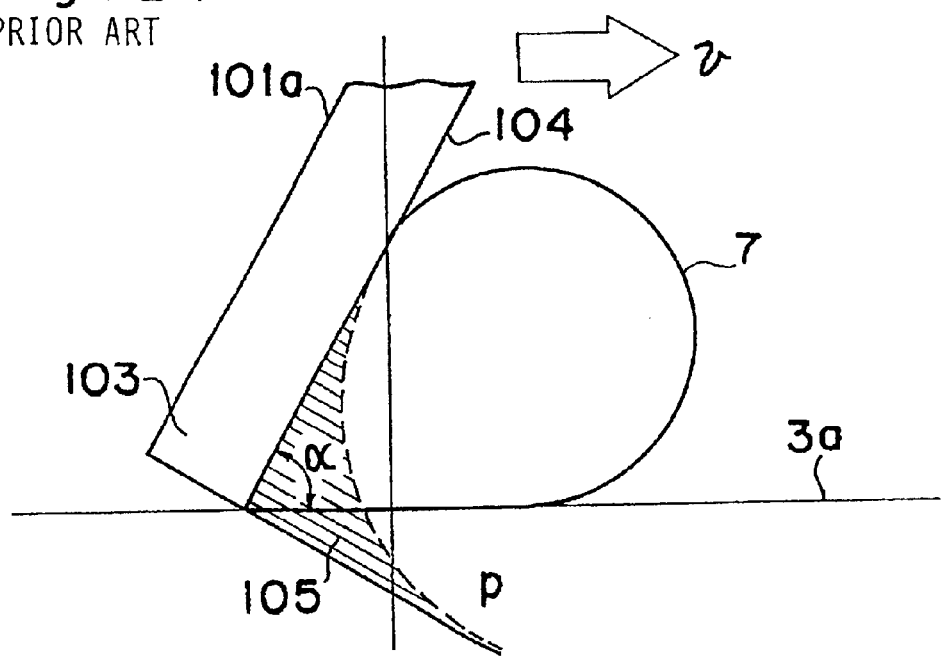
FIG. 24 is a diagram of a distribution of a filling pressure generated in the solder paste by the squeegee of FIG. 20.
Figure 25:
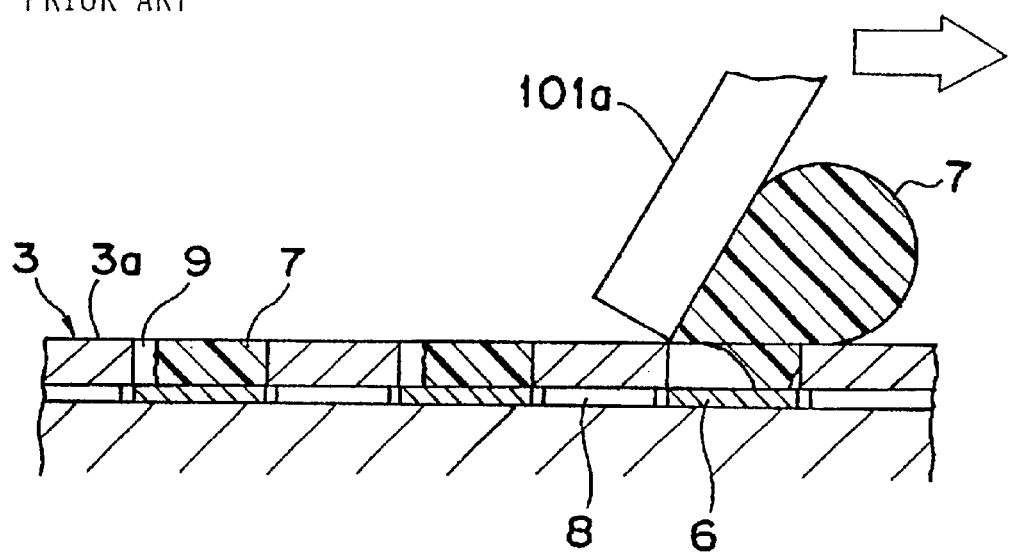
FIG. 25 is a diagram of a state when non-filled parts are formed in the openings of the mask.
Figure 26:
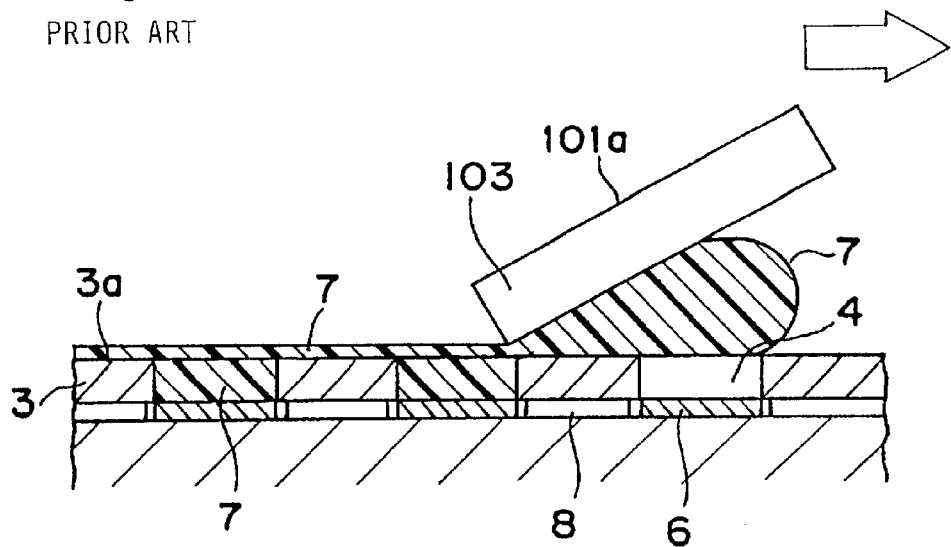
FIG. 26 is a diagram of a state where the solder paste is left on the surface of the mask when a front end part of the squeegee of FIG. 20 is largely deformed.
Figure 27:
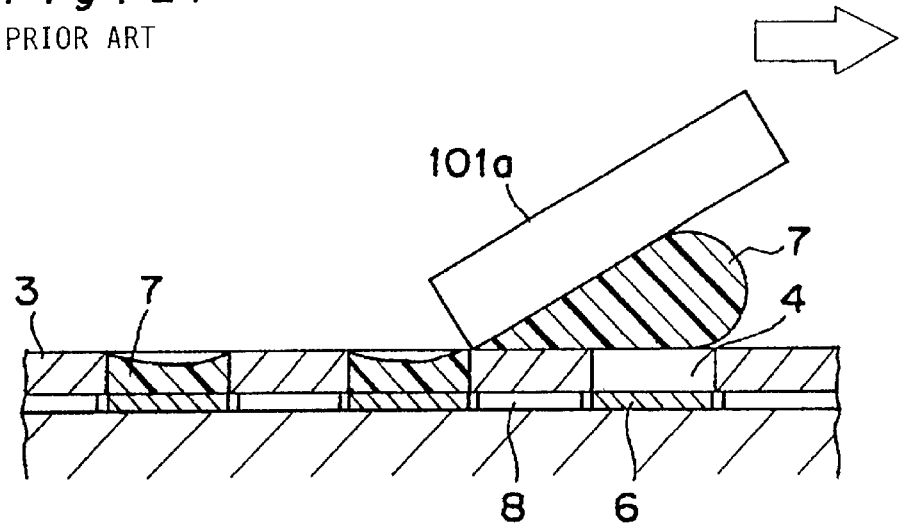
FIG. 27 is a diagram of a state where the solder paste filled in the openings is scraped when the front end part of the squeegee of FIG. 20 is largely deformed.

The filling pressure and a pressure distribution generated in the solder paste 7 by the filling member 22 of the filling squeegee 10 can be considered in the same way. In comparing a shaded part 303 in FIG. 4 with the shaded part 105 in FIG. 24, it is clear that the high filling pressure is generated in a wider range with the employment of the filling squeegee 10. Accordingly, the solder paste is perfectly filled into openings 4 even if the fill time is short. A filling defect or failure such as an unfilled part, etc. is never brought about even at an increased squeegee speed, and thus stable printing is accomplished.

The above-described filling member 22 is held by the holding member 23, which is coaxial with the driving shaft 11a, in a manner so as to be able to be swung about both in the right and in the left printing directions about a pin 27. As will be described later, the holding member 23 is provided with the angle variable device 12 such as a motor or a cylinder so as to make variable an intersection angle between the filling pressure face 25 of the filling member 22 and the surface 3a of the mask 3, and to maintain the filling member 22, which can swing about the pin 27, at the proper intersection angle. One end of a main body of the angle variable device 12 is supported rotatably by the holding member 23, and a front end part of a driving shaft 12a, which can move forwards and backwards with respect to the main body, is rotatably coupled to a shoulder part 22a of the filling member 22. Therefore, the filling member 22 swings about a fulcrum at the pin 27 when the driving shaft 12a is moved forwards and backwards. The angle variable device 12 is also connected to the control device 48, and the angle variable device 12 changes the intersection angle by advancing or retreating the driving shaft 12a under the control of the control device 48.

Figure 28:
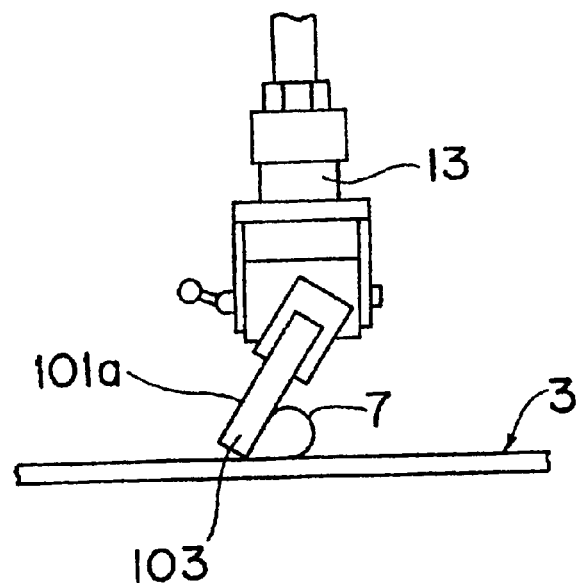
FIG. 28 is a diagram of a state when a reaction force detector is attached to the printing squeegee in the conventional solder paste printing apparatus of FIG. 20.
Figure 29:
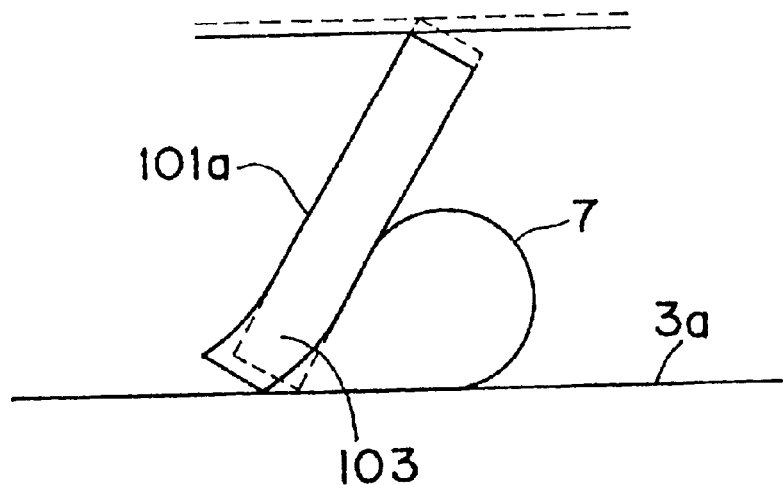
FIG. 29 is a diagram showing how the reaction force detector of FIG. 28 cannot detect a reaction force of the solder paste.

According to the present embodiment, the holding member 23 is connected to the driving shaft 11a of the up-down driving device 11 via the reaction force detector 13 such as a load cell so as to detect a reaction force acting on the filling pressure face 25 of the filling member 22 via the solder paste 7 at the time of printing. The reaction force cannot be detected simply by providing the conventional solder paste printing apparatus with the reaction force detector 13. The reason for this will be discussed with reference to FIG. 28. The front end part of a conventional printing squeegee 101a moves while keeping in contact with the surface 3a of the mask 3, and consequently is largely deformed due to friction, as shown in FIG. 29. A contact point between the front end part of the squeegee 101a and the surface 3a of the mask 3 is not present in a vertical direction of the reaction force detector. When the contact point of the squeegee 101a is pressed up by the reaction force of the solder paste 7, an end part of the squeegee 101a at the side opposite to the contact point is pulled towards the mask 3. The reaction force detector virtually detects this tensile force on the mask 3 in spite of the reaction force of the solder paste 7 acting to the squeegee 101a. The reaction force detector 13 hence cannot detect the reaction force of the solder paste 7. In contrast, because the filling squeegee 10 of the printing apparatus 51 of the embodiment moves without touching the surface 3a of the mask 3, the reaction force of the solder paste 7 can be detected.

As is clear from FIG. 3 and expression (2), the reaction force acting to the filling pressure face 25 can be obtained by integrating the pressure p' in a range of X=0–L. The filling pressure can be known from the reaction force of the solder paste 7 detected by the reaction force detector 13. Moreover, the pressure p' can be changed by adjusting the sizes h1 and h2 of the gaps H1 and H2, as is understood from the expression (2), and the sizes h1 and h2 can be adjusted by driving at least either the up-down driving device 11 on the angle variable device 12 of the squeegee 10.

For the above purpose, the reaction force detector 13 is connected to the control device 48. The control device of the drive of the up-down driving device 11 based on information of the reaction force detected by the reaction force detector 13. The up-down driving device moves the filling member 22 up/down via the driving shaft 11a so as to adjust the size h2 of the gap H2 or the size h1 of the gap H1 to prevent the unfilled part 9 from being formed in the openings 4 of the mask 3. The control device 48 controls the drive of the angle variable device 12 to adjust the intersection angle. For example, even if the physical properties of the solder paste (particularly the viscosity η) is changed due to an environmental change or the like, and the filling pressure is changed, or the kind of the solder paste 7 is changed when the type of product is switched (etc.), the control device 48 operates at least one of the up-down driving device 11 and the angle variable device 12 so that the information of the reaction force of the solder paste 7 detected by the detector 13 is approximated to a present reaction force value or a reaction force value before the type is switched. In this manner, at least one of the height of the filling squeegee 10 and the intersection angle is changed and the sizes h1 and h2 are adjusted. In other words, printing conditions are automatically adjusted and changed to achieve stable printing. Controlling the up-down driving device 11 and the angle variable device 12 by the control device 48 may be carried out in real time along with the movement of the filling squeegee 10, for every circuit board or during printing.

The printing conditions are thus automatically adjusted for maintaining stable printing and shortening process time.

Figure 5:
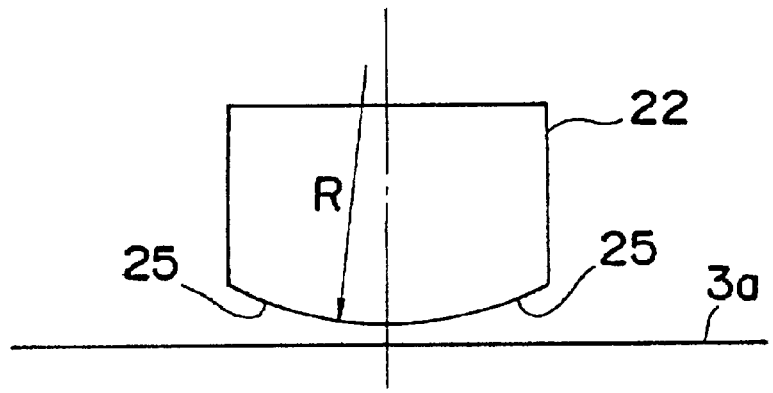
FIG. 5 is a diagram of the filling member of the filling squeegee of FIG. 1 in a different embodiment.
Figure 7:
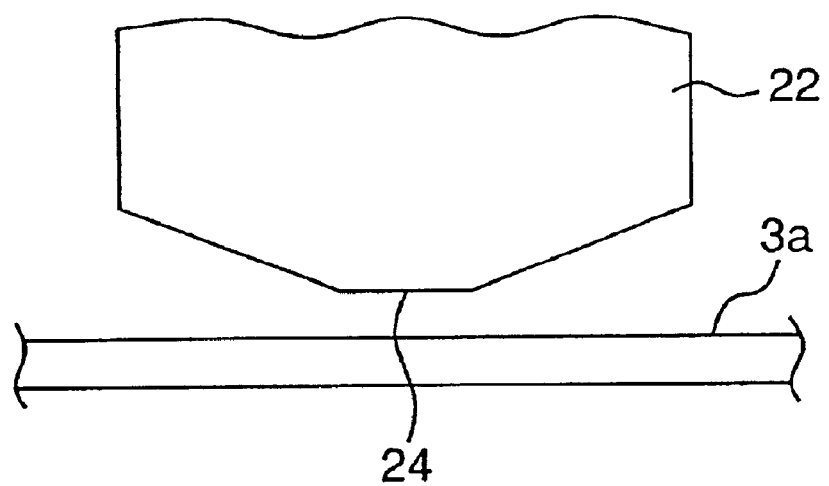
FIG. 7 is a diagram of the filling member of the filling squeegee of FIG. 1 in yet another embodiment.

Although the filling pressure face 25 of the filling member 22 of the filling squeegee 10 is flat in this embodiment, the face 25 is not limited to a flat surface and may be a curved face projecting to the surface 3a as exemplified in FIG. 5. In other words, the shape of the filling pressure face 25 is not specified so long as the size h1 of the gap between the filling pressure face 25 and the surface 3a of the mask 3 is larger than the size h2 with respect to the printing direction (i.e., h1>h2 is satisfied). At the same time, the tip end 24 of the filling member may be sharp as in FIG. 2, or flat parallel to the surface 3a over a suitable length in the printing direction as shown in FIG. 7.

The reaction force detector 13 and angle variable device 12 can be set at any position so long as their respective functions are fulfilled, and the reaction force detector 13 and angle variable device 12 are not restricted to the above-described positions.

Since the printing apparatus 51 moves both in the right and the left directions, the printing apparatus is equipped with two scraping squeegees 14a, 14b. The printing apparatus may move in either direction only, and in that case, the scraping squeegee 14a or 14b corresponding to the moving direction is provided.

Figure 6:
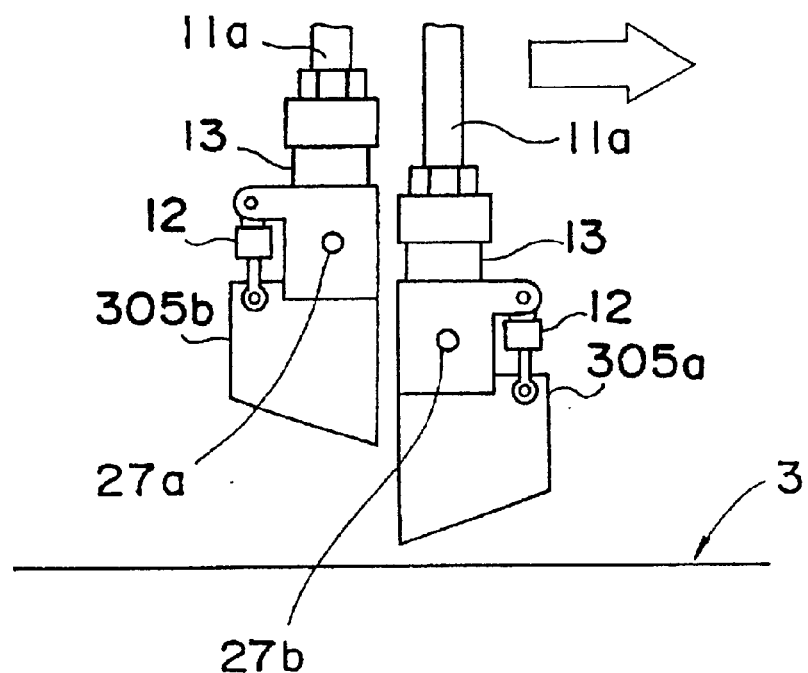
FIG. 6 is a diagram of the filling squeegee of FIG. 1 in a different embodiment.

In the present printing apparatus 51, the filling member 22 of the filling squeegee 10 is formed to be symmetric at both the right and the left sides, and the same filling squeegee 10 is used for both printing directions. However, as shown in FIG. 6, the filling squeegee may be divided into a right (first) filling squeegee portion 305a and a left (second) filling squeegee portion 305b to operate and print individually. Using the two filling squeegees portions 305a, 305b has the following advantages. In the case of the single filling squeegee 10, when the height or the intersection angle of the squeegee 10 is not controlled in real time, but is set before the printing is started, the printing conditions may be different in the two printing directions. If the height or the intersection angle of the squeegee 10 changes during printing in the right direction, the up-down driving device 11 or angle variable device 12 should be operated before the start of the left printing in order to obtain the same printing conditions in the left printing direction as well. In comparison, when the two filling squeegees portions 305a, 305b are provided, the up-down driving devices 11 and angle variable devices 12 can be driven separately beforehand in accordance with the printing directions.

The operation of the above-constituted apparatus 51 will be described with reference to FIGS. 1 and 8. The up-down driving device(s) 11 and angle variable device(s) 12 are controlled in real time in the description hereinbelow.

Figure 8:
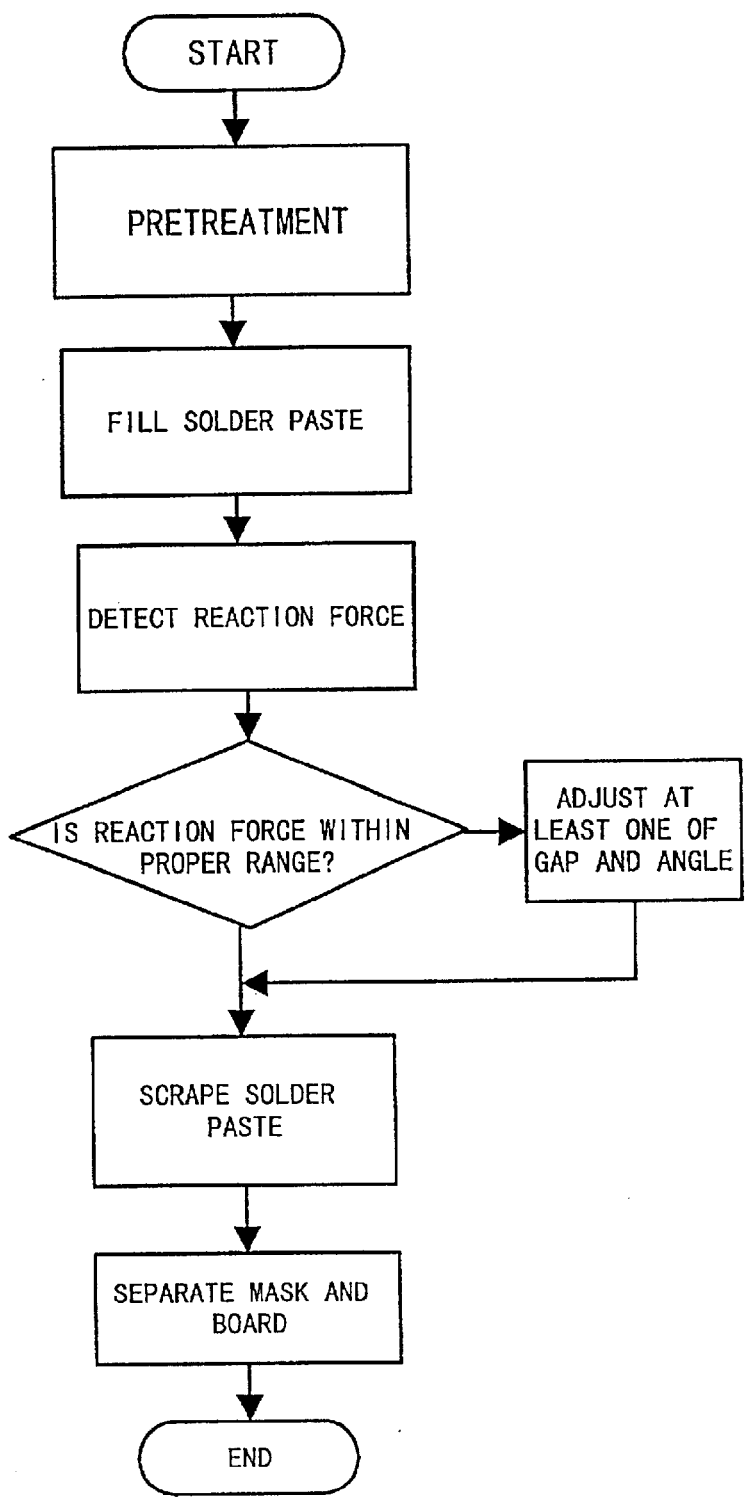
FIG. 8 is a flow chart of the operation of the solder paste printing apparatus of FIG. 1.

The following operations are carried out in step 1 (FIG. 8). A predetermined amount of the solder paste 7 is supplied to the surface 3a of the mask 3. When the printing is performed in the right direction, the printing board 5 is positioned and overlapped with the mask 3. The filling squeegee 10 and right scraping squeegee 14a are lowered respectively by the up-down driving devices 11 and 15. At this time, the front end part 20 of the scraping squeegee 14a is brought in contact with the surface 3a of the mask 3 with a suitable pressing force. The filling squeegee 10 is, as shown in FIG. 2, not in contact with the surface 3a of the mask 3, and this creates the gap H2 of the predetermined size h2. The squeegee 10 is moved down so that the gap H2 is located behind the supplied solder paste 7 in the printing direction.

In step 2, while the previous state is maintained, the bed plate 17 is moved right by the driving device 49, and the filling squeegee 10 and scrapping squeegee 14a are moved linearly in the right printing direction. The filling of the solder paste 7 into the openings 4 of the mask 3 by the filling squeegee 10 is thus started.

The reaction force acting on the filling squeegee 10 is detected by the reaction force detector 13 in step 3. Whether or not the detected reaction force is, for example, within the present reaction force value as described above is judged in step 4. When the detected reaction force is outside a proper range, the control device 48 drives least one of the up-down driving devices 11 and the angle variable device 12 to bring the detected reaction force within the proper range in step 5. At least one of the height and the intersection angle of the filling squeegee 10 is changed accordingly.

In step 6, a layer of the solder paste 7, which is formed on the surface 3a of the mask 3 because of the gap H2 of the filling squeegee 10, is scraped by the scraping squeegee 14a. Through the scraping by the scraping squeegee 14a, the unnecessary solder paste 7 on the surface 3a of the mask 3 is removed. The solder paste 7 filled in the openings 4, which swells over the surface 3a, is scraped to be even with the surface 3a.

Thereafter, the printed board 5 is separated from the mask 3 to complete the printing of the solder paste 7. The left printing is similar to the right printing. After the printed board 5 is positioned and overlapped with the mask 3, the filling squeegee 10 and the left scraping squeegee 14b are lowered by the up-down driving devices 11 and 16. In this case, also, the front end part 20 of the scraping squeegee 14b is brought into contact with the surface 3a of the mask 3 with a suitable pressing force. The filling squeegee 10 is not in direct contact with the surface 3a of the mask 3, and the gap H2 of the predetermined size h2 is maintained. The filling squeegee 10 is lowered so that the gap H2 is positioned leftward behind the solder paste 7 in the printing direction. The subsequent operations are carried out in the same manner as in the right printing.

The above-described printing operations are repeated alternately. The solder paste 7 is continuously printed and applied on lands 6 of the printed board 5 via the mask 3.

According to the present embodiment, the side face 21 of the scraping squeegee 14a, 14b is inclined with an optional acute or obtuse angle to the surface 3a of the mask 3 at the time of actual printing in order to scrape unnecessary solder paste 7. However, the scraping squeegee 14a, 14b may be inclined beforehand axially with respect to the surface 3a of the mask 3 so that the side face 21 of the squeegee 14a, 14b, may be inclined beforehand with an optional acute or obtuse angle. This will be described hereinbelow.

Figure 9:
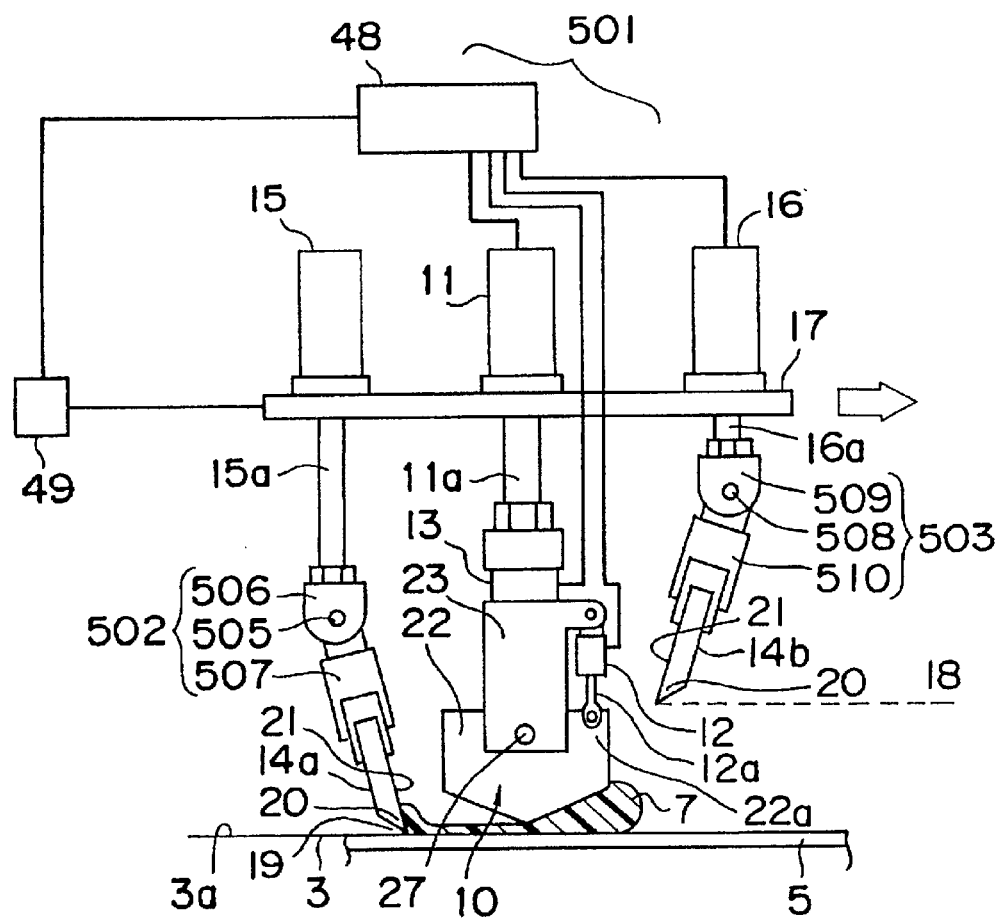
FIG. 9 is a diagram of a modified example of the solder paste printing apparatus in FIG. 1.

More specifically, in a solder paste printing apparatus 501 shown in FIG. 9, the scraping squeegees 14a, 14b, are held by holders 507, 510 which are connected to holding members 506, 509. The holding members 506, 509 are fitted to driving shafts 15a, 16a of the up-down driving devices 15, 16 via pins 505, 508. The pins 505, 508 are arranged coaxially with the driving shafts 15a, 16a and support the holders 507, 510 so that the holders 507, 510 can swing in the left and right printing directions with respect to the holding members 506, 509. Consequently, the side face 21 of each scraping squeegee 14a, 14b, can be positioned with respect to the surface 3a of the mask 3 with an optional angle in a range from an acute angle to right angles to an obtuse angle. The pins 505, 508, for instance, include clamping members such as bolts and nuts. The holders 507, 510 are prevented from swinging, and the squeegees 14a, 14b are fixed at the optional angle by clamping of the pins 505, 508.

The holders 507, 510 may be adapted to swing about the pins 505, 508 by a known mechanism using, e.g., a motor or the like in order to be fixed at the optional angle.

As described hereinabove, the pins 505, 508, holding members 506, 509 and holders 507, 510 constitute angle setting devices 502, 503 for the scraping squeegees 14a, 14b. The solder paste printing apparatus 501 of FIG. 9 is the same as the printing apparatus 51 described with reference to FIG. 1 with the exception of the above described points.

Figure 12:
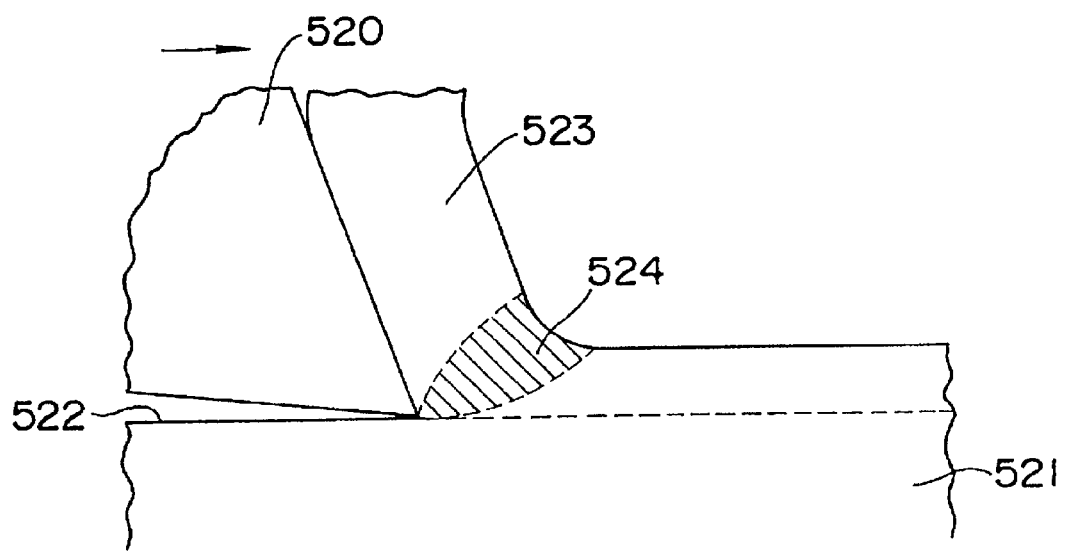
FIG. 12 is a diagram of a model explanatory of why the solder paste is scraped by the scraping squeegee of FIG. 11.

In the case where the side face 21 of the scraping squeegee 14a, 14b is set, for example, at an obtuse angle with respect to the surface 3a of the mask 3, (as indicated in FIG. 11) the unnecessary solder paste 7 on the surface 3a can be removed without influencing to the utmost the solder paste 7 filled in the openings 4 of the mask 3 by the filling squeegee 10. The reason for this will be made clear with reference to FIG. 12 which shows a general shearing model of cutting a structure 521 by a tool 520. When the structure 521 is cut by the tool 520, as shown in the above model, a shear force by the tool 520 acts mainly on an upper part and not on a finish face 522. The shear force acts mainly in a shaded shear area 524 in FIG. 12. The shear force acts only on a portion which becomes a chip part 523. Therefore, in FIG. 12, if the tool 520 is replaced with the scraping squeegee 14a, 14b, the structure 521 below the finish face 522 is replaced with the solder paste 7 filled in the openings 4, and the chip part 523 is replaced with the unnecessary solder paste 7 on the surface 3a, the shear force acts solely on the unnecessary solder paste 7 on the surface 3a when the side face 21 of the scraping squeegee is set at an obtuse angle. Accordingly, the unnecessary a solder paste 7 on the surface 3a can be removed without affecting the solder paste 7 filled in the openings 4.

On the other hand, when the side face 21 of the scraping squeegee 14a, 14b is set to be an acute angle with respect to the surface 3a of the mask 3, the following effect is obtained. For instance, even when the solder paste 7 is filled insufficiently by the squeegee 10 into the openings 4 thereby forming the non-filled parts 9, the solder paste 7 can be surely filled in the openings 4 by the scraping squeegee 14a, 14b with the acute angle. When the scraping squeegee 14a, 14b is set with the acute angle as in FIG. 13, not only does the filling squeegee 10 produce the filling pressure, but the scrapping squeegee 14a, 14b additionally produces the filling pressure. Therefore, the scraping squeegee 14a, 14b can be effective to refill the solder paste 7 into the openings 4 where the non-filled parts 9 are present, and at the same time, remove the unnecessary solder paste 7 on the surface 3a.

Figure 14:
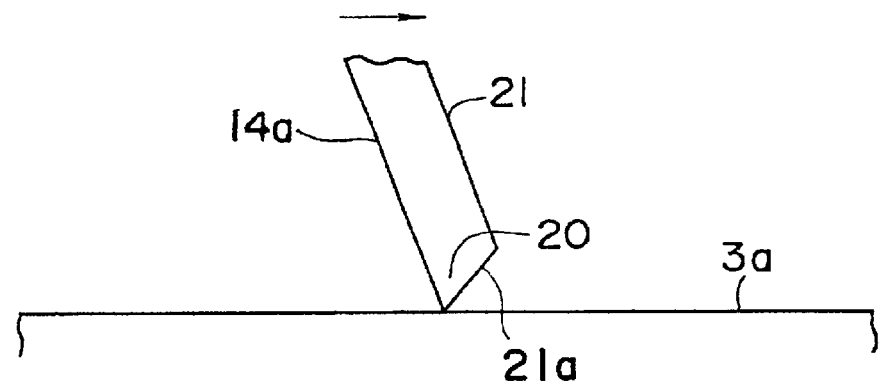
FIG. 14 is a diagram when an angle of the side face of the scraping squeegee to the surface of the mask is varied in the solder paste printing apparatus of FIG. 9.
Figure 15:
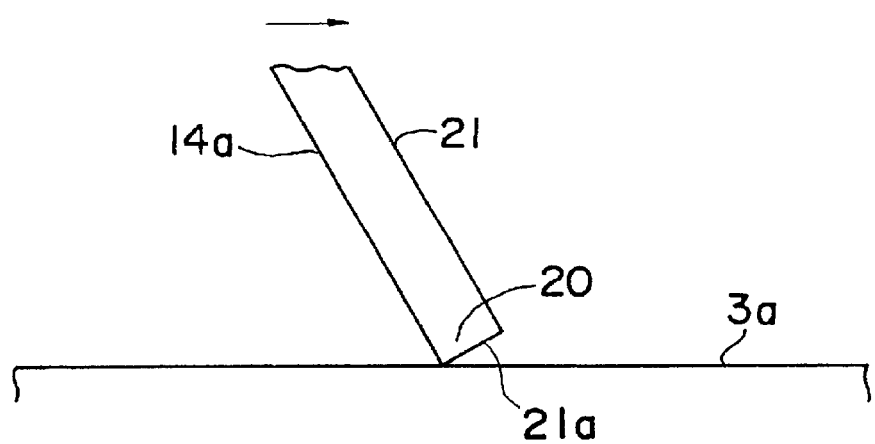
FIG. 15 is a diagram when the angle of the side face of the scraping squeegee to the surface of the mask is varied in the solder paste printing apparatus of FIG. 9.
Figure 16:
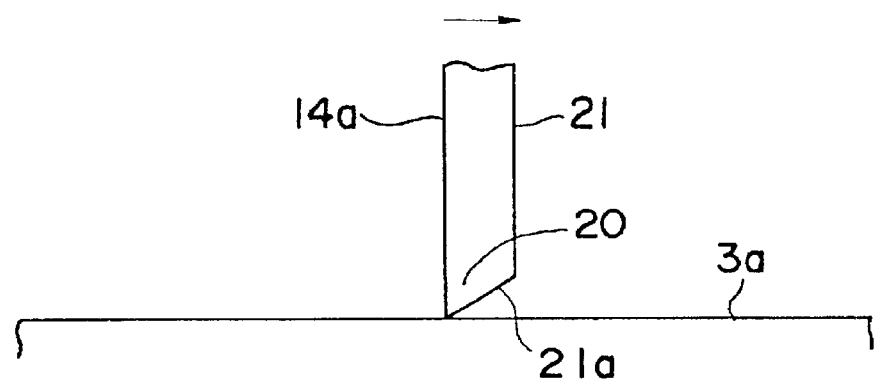
FIG. 16 is a diagram when the angle of the side face of the scraping squeegee to the surface of the mask is varied in the solder paste printing apparatus of FIG. 9.

As shown in FIGS. 14–16, the same effect as described above can be attained also when the side face 21 is set to an obtuse angle or right angles with respect to the surface 3a. The configuration of the front end part 20 of each of the squeegees 41a, 14b depend on an angle of the face 21a, which is separate from the side face 21. The angle of the face 21a is acute with respect to the surface 3a, as compared with the front end part 20 the scraping squeegee 14b being brought into contact with the surface 3a. Even though an angle of the side face 21 is set to be obtuse or a right angle, the effect similar to that in a case where the angle is acute can be obtained. The solder paste 7 is filled into the openings 4 mainly by the filling squeegee 10, while the scraping squeegee 14a, 14b assists the filling. Therefore, it is enough that the filling pressure generated by the scraping squeegee 14a, 14b is smaller than that of the filling squeegee 10, and thereby allowing the side face 21 of the squeegee 14a, 14b to be set with a large angle, without creating the problem when the squeegee angle α is reduced in the conventional squeegee. The non-filled part 9 can be prevented even when the squeegee speed is increased, and stable printing can be achieved.

Figure 10:
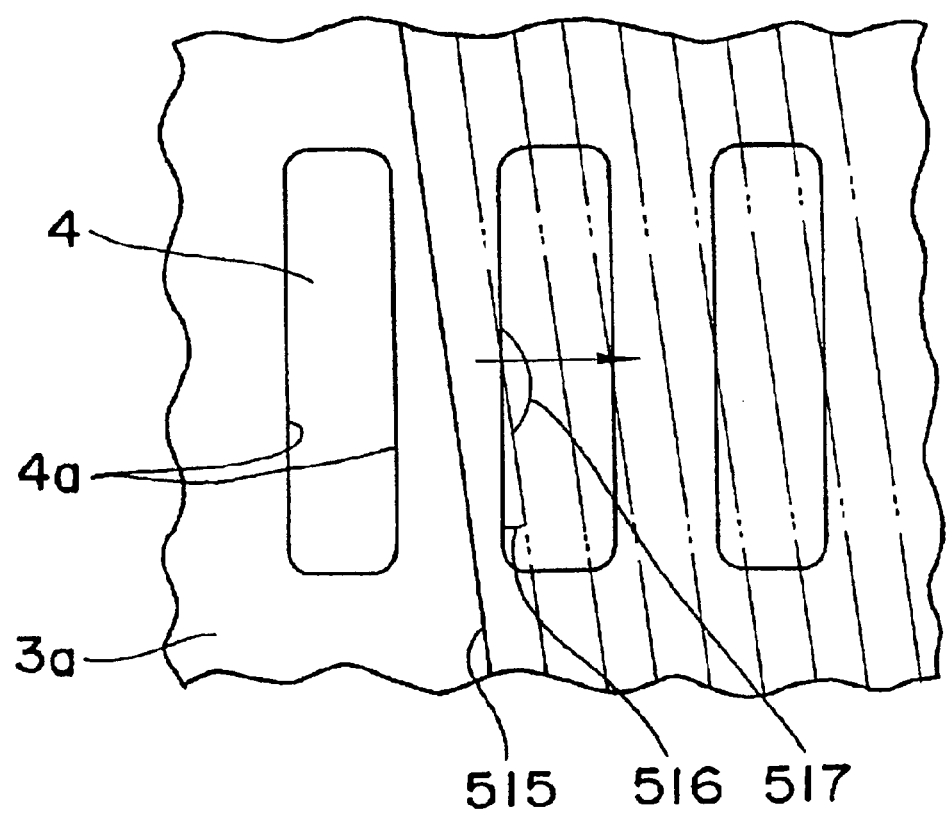
FIG. 10 is a diagram of an arrangement relationship between a line of contact of a scraping squeegee and mask, and an opening in the solder paste printing apparatus of FIG. 9.

Further, as indicated in a schematic view of an upper face of the mask in FIG. 10, the scraping squeegee 14a, 14b is preferably arranged so that a line of contact 515 between the front end part 20 of the squeegee and the surface 3a of the mask 3 is not parallel to an extending direction of a side edge part defining the opening 4 in the mask 3. The openings 4 of the mask are sometimes formed in a pattern so that the extending direction of the side edge part defining the opening 4 is linear, and a straight part 4a is formed having its extending direction orthogonal to a printing direction shown by an arrow. In this state, if the scraping squeegee 14a, 14b is moved in the printing direction while an extending direction of the line of contact 515 is orthogonal to the printing direction, (namely, the extending direction of the line of contact 515 is in parallel to the extending direction of the straight part 4a) the front end part 20 of the scraping squeegee 14a, 14b is caught by the straight part 4a of the opening 4 of the mask 3, whereby the front end part 20 or opening 4 is possibly broken. Therefore, the scraping squeegee 14a, 14b is preferably fitted to the driving shaft 15a, 16b of the up-down driving device 15, 16 so that an angle 516 of the extending direction of the line of contact 515 to the extending direction of the straight part 4a is acute or an angle 517 is obtuse to let the extending direction of the line of contact 515 intersect with the extending direction of the side edge part defining the opening 4. The above angle 516 is preferably at approximately 1 to 45°, and is most preferable at 45°. The scraping squeegee 14a, 14b may be fitted to the driving shaft 15a, 16b in a manner to make the angle 516, 517 changeable.

In the foregoing embodiment, the scraping squeegee 14a, 14b is orientated with respect to the mask 3 so that the openings 4 of the mask 3 are not parallel to the extending direction of the line of contact 515. Opposite to the above, the mask 3 may be shifted relative to the scraping squeegee 14a, 14b so as to make the straight part 4a not parallel to the line of contact 515 with the extending direction of the line of contact 515 kept orthogonal to the printing direction. In the event that the openings 4 of the mask 3 are formed in a pattern not having the straight parts 4a parallel to the extending direction of the line of contact 515, it is unnecessary to orient the scraping squeegee 14a, 14b (for example, assuming the acute angle 516).

In the above embodiment, the reaction force detector 13 is set on the driving shaft 11a of the up-down driving device 11 of the filling squeegee 10 to detect the reaction force of the solder paste 7 acting on the whole face of the filling squeegee 10. However, the filling pressure by the solder paste 7 onto the opening 4 can be detected directly in an embodiment as will be described below.

Figure 17:
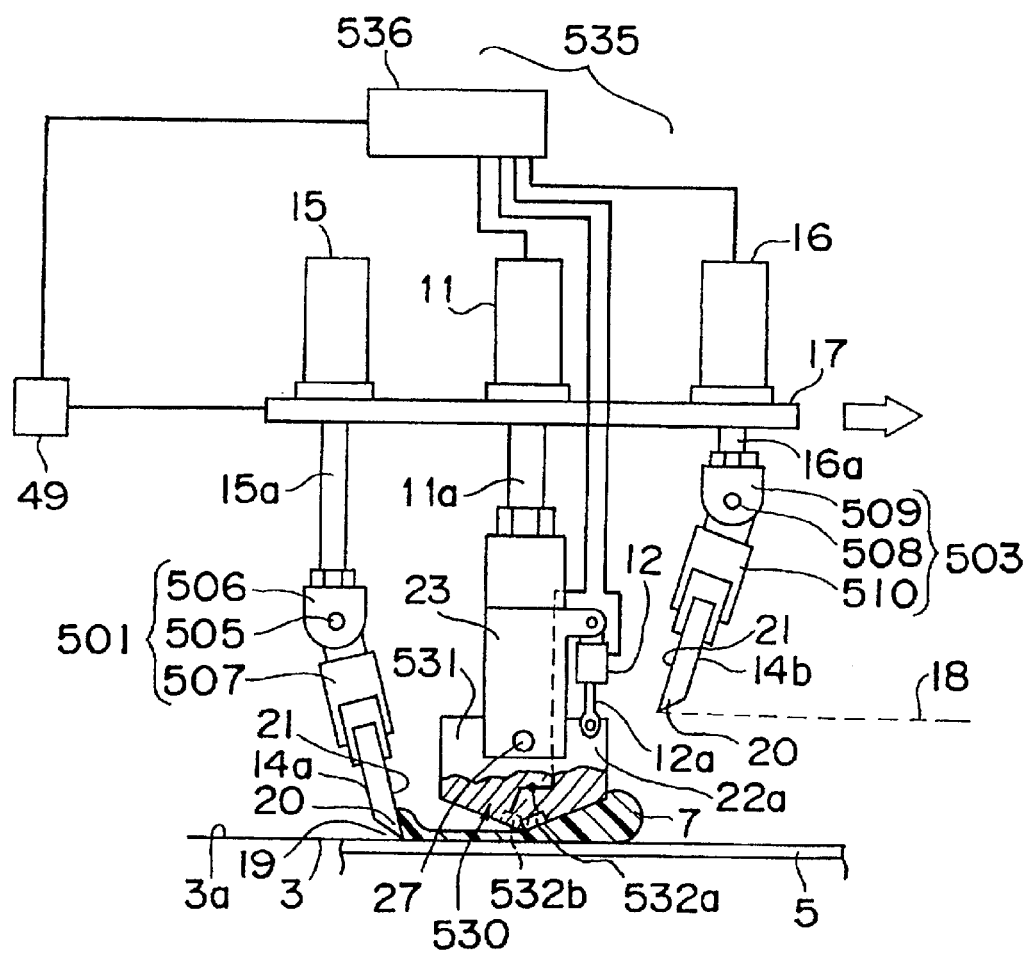
FIG. 17 is a diagram of a further modification of the solder paste printing apparatus of FIG. 1.

In a solder paste printing apparatus 535 shown in FIG. 17, a filling squeegee 530 corresponding to the above filling squeegee 10 generally includes (similar to the filling squeegee 10) a filling member 531 which corresponds to the filling member 22 and the holding member 23 for holding the filling member 531. The filling squeegee 530 is coupled to the driving shaft 11a of the up-down driving device 11, for the filling squeegee 530, and the up-down driving device 11 is mounted to the bed plate 17. The up-down driving device 11 is connected to a control device 536 and is driven via the control device 536 (as will be described later) based on information from outputs of a pressure detector 532a or 532b in order to raise or lower the driving shaft 11a.

Figure 18:
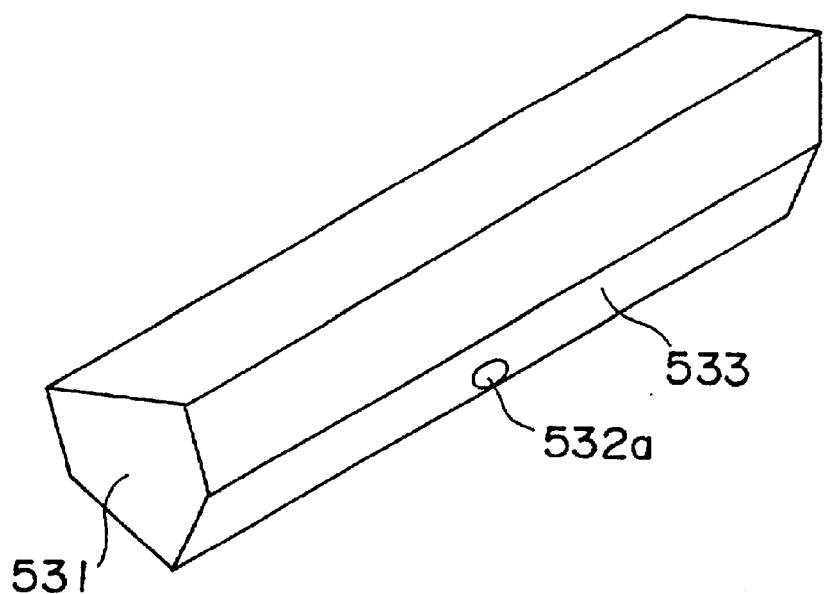
FIG. 18 is a perspective view of a filling member of a filling squeegee in the solder paste printing apparatus of FIG. 17.
Figure 19:
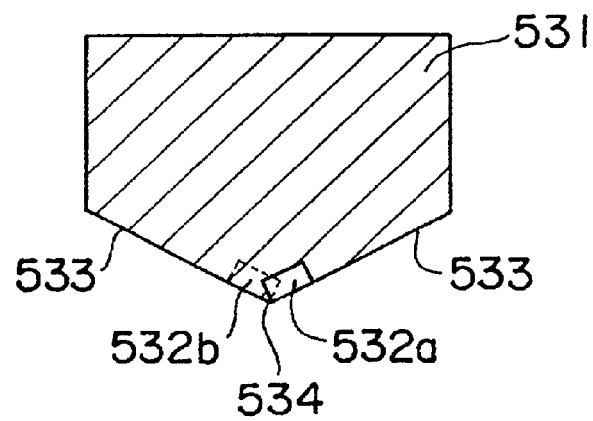
FIG. 19 is a sectional view of the filling member of FIG. 18.
Figure 20:
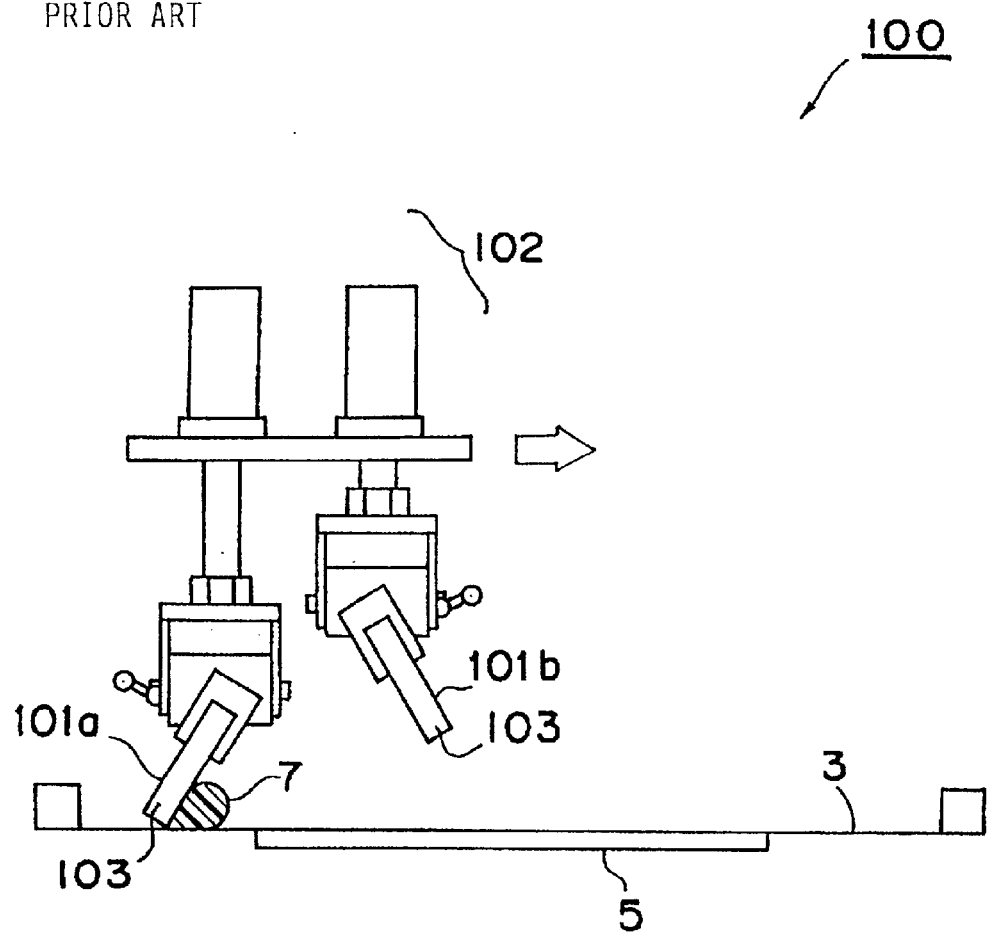
FIG. 20 is a diagram showing the structure of a conventional solder paste printing apparatus.
Figure 21:
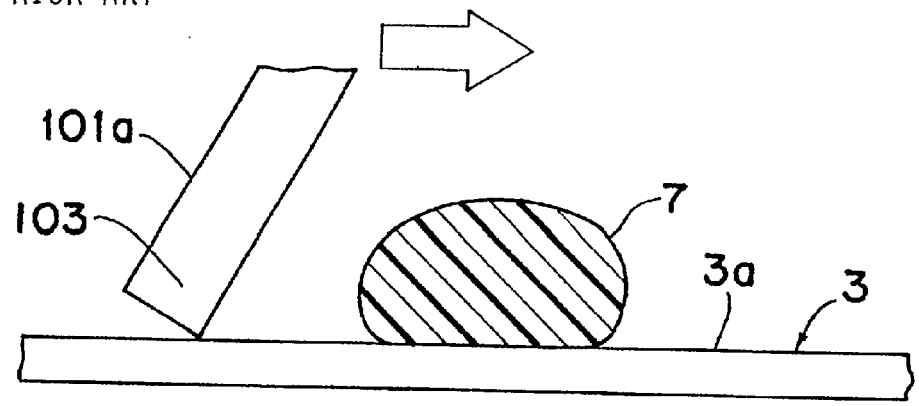
FIG. 21 is a diagram showing a state when printing is conducted with the use of a squeegee of FIG. 20.
Figure 22:
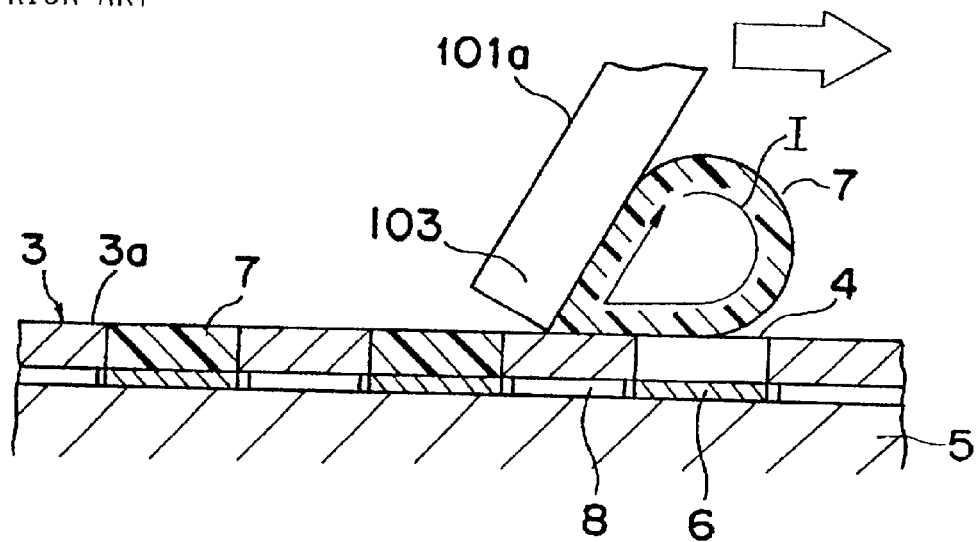
FIG. 22 is a diagram of a state when the solder paste is filled in the openings by the squeegee of FIG. 20.
Figure 23:
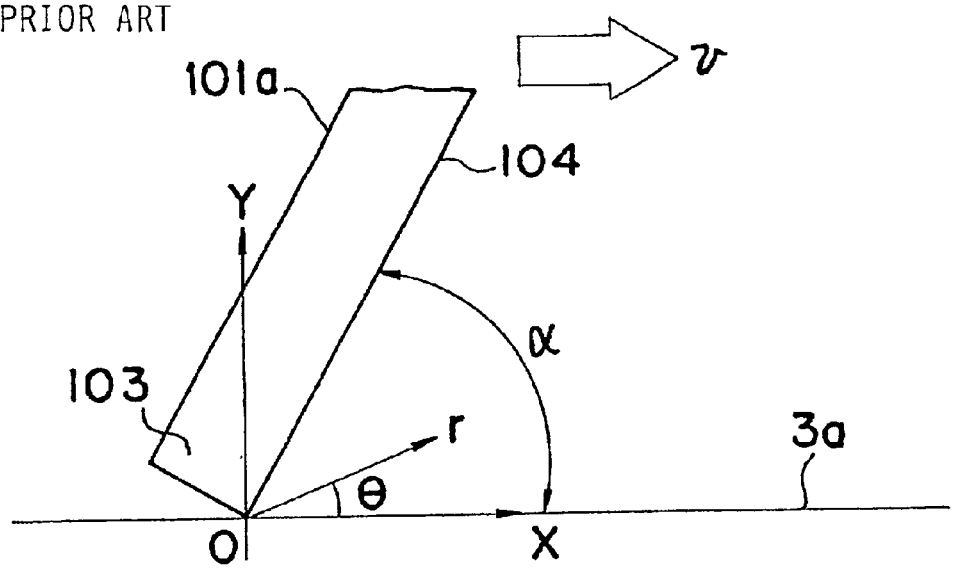
FIG. 23 is a diagram of a model for obtaining a filling pressure produced in the solder paste by the squeegee of FIG. 20.

As shown in FIGS. 18 and 19, the pressure detector 532a, 532b is built in the filling member 531 in the vicinity of the center in an axial direction of the filling member 531 and at a front end part 534 of the filling member 531 inside a filling pressure face 533. The pressure detector 532a, 532b is set at a position where the solder paste 7 is present at the time of printing so as to detect the filling pressure generated when the solder paste 7 is filled into the openings 4 by the filling squeegee 530. At least one detector is provided for each filling pressure face 533. As described earlier, the filling pressure shows a maximum value in the pressure distribution of pressure in the vicinity of the front end 534 of the filling member 531. Therefore, the pressure detector 532a, 532b is preferably set in the vicinity of the front end 534 of the filling member 531. Moreover, in order to more correctly detect the filling pressure, the pressure detector 532a, 532b is built in the filling member 531 so as to have its pressure detection face exposed to the filling pressure face 533 as illustrated in the drawings.

The remaining structure of the solder paste printing apparatus 535 in FIG. 17 is equivalent to those of the solder paste printing apparatuses 51, 501 shown in FIGS. 1 and 9, with the exception of the above discussed points.

Differences between the reaction force detector 13 of the printing apparatus 51 and the pressure detectors 532a, 532b of the printing apparatus 535 in the above embodiments will now be described. Although both detectors are installed to detect a state change of the filling pressure of the solder paste 7 at the time of printing, the pressure detector 532a, 532b directly detects the filling pressure, whereas the reaction force detector 13 detects the reaction force which is a sum of the filling pressures acting on the whole face of the filling pressure face 25. In other words, the reaction force detector 13 detects the filling pressure indirectly.

Even when the filling pressure is the same, the reaction force detector 13 detects the reaction force differences in accordance with an area of the filling pressure face 25. For example, if a size of the filling member 22 is changed to fit the printed board 5, it takes a lot of labor to reference the previously accumulated information of reaction forces in order to reproduce printing conditions. Needless to say, it is easy to refer to the previously accumulated information unless the area of the filling pressure face 25 is changed when the same filling member 22 is used. On the other hand, since the filling pressure is detected directly with the use of the pressure detector 532a, 532b, the previously detected information of pressures can be readily referenced even if the filling member 531 is changed in size. Thus, the printing conditions can be reproduced easily, which is preferable.

The apparatus 535 operates in the same manner to print the solder paste as the printing apparatus 51 of the above discussed embodiment. Fundamentally, the "reaction force" in steps 3 and 4 in FIG. 8 is replaced with the "pressure". More specifically, the filling pressure generated when the solder paste 7 is filled in the openings 4 by the filling squeegee 530 is detected by the pressure detector 532a in step 3, and whether or not the detected pressure is, for instance, within a preliminarily set value range is judged in step 4. If the detected pressure is outside the proper range, in step 5, the control device 536 drives at least one of the up-down driving device 11 and the angle variable device 12 so as to set the detected pressure in the proper range. Consequently, at least one of the height and intersection angle of the filling squeegee 530 is changed.

The remaining operations, other than the above discussed, are the same as in the printing apparatus 51. The solder paste 7 is continuously printed and applied onto lands 6 of the printed board 5 via the mask 3 through the alternate repetition of the above described operations.

In the foregoing description, only the reaction force detector 13 or the pressure detectors 532a, 532b are arranged in the apparatus. However, both of the detectors may be set in the printing apparatus to detect both the reaction force and the filling pressure.

According to the solder paste printing apparatus in accordance with the first aspect of the present invention and the solder paste printing method in accordance with the second aspect of the present invention, the filling squeegee and scraping squeegees are provided. The filling squeegee is moved without contacting the surface of the mask thereby filling the solder paste into the openings of the mask, and then the unnecessary solder paste on the mask is removed by the scraping squeegee. Accordingly, the solder paste is prevented from being filled into the openings defectively or scraped improperly even when the squeegee speed is increased, so that the solder paste can be printed stably on the circuit board. The print time can be reduced, to thereby improve productivity.

The entire disclosure of Japanese Patent Application No. 8-329758 filed on Dec. 10, 1996 and No. 9-134778 filed on May 26, 1997, including specification, claims, drawings, and summary are incorporated herein by reference in their entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A solder paste printing apparatus comprising:
a squeegee device operable to move in a printing direction across a front surface of a mask having openings formed therein so as to apply solder paste on the front surface of the mask onto a face of a circuit board positioned at a rear surface of the mask via the openings in the mask, said squeegee device including:
a filling squeegee having a tip end and a filling pressuring face extending from said tip end in the printing direction at an upward incline relative to the front surface of the mask, said filling pressuring face being arranged so as to oppose the front surface of the mask to thereby press the solder paste against the front surface and fill the solder paste into the openings in the mask as said squeegee device moves across the front surface, said filling squeegee being shaped and arranged so as to form a gap between said tip end and the front surface of the mask such that said filling squeegee does not contact the front surface of the mask as said squeegee device moves across the front surface; and
a scraping squeegee arranged behind said filling squeegee with respect to the printing direction, said scraping squeegee being arranged and operable to move in the printing direction while contacting the front surface during printing so as to remove excess solder paste from the front surface; and
an angle setting device for adjusting a position of said scraping squeegee such that a pushing face of said scraping squeegee forms one of a right angle, an acute angle, and an obtuse angle with the front surface of the mask.

2. The solder paste printing apparatus of claim 1, wherein said squeegee device is operable to move in a first printing direction across the front surface and in a second printing direction across the front surface, the second printing direction being opposite the first printing direction, said scraping squeegee comprising a first scraping squeegee arranged behind said filling squeegee with respect to the first printing direction, said squeegee device further including a second scraping squeegee arranged behind said filling squeegee with respect to the second printing direction.

3. The solder paste printing apparatus of claim 2, wherein said first scraping squeegee and said second scraping squeegee are each operable to move in a vertical direction with respect to the front surface of the mask independent of each other.

4. The solder paste printing apparatus of claim 2, wherein said filling squeegee comprises a first filling squeegee portion and a second filling squeegee portion separate from said first filling squeegee portion, said first filling squeegee portion being adjacent to said second filling squeegee portion along the front surface of the mask.

5. The solder paste printing apparatus of claim 4, wherein said first filling squeegee portion and said second filling squeegee portion are each operable to move in a vertical direction with respect to the front surface of the mask independent of each other.

6. The solder paste printing apparatus of claim 1, wherein said angle setting device positions said scraping squeegee so that said pushing face forms an obtuse angle with the front surface of the mask.

7. The solder paste printing apparatus of claim 1, wherein said angle setting device positions said scraping squeegee so that said pushing face forms an acute angle with the front surface of the mask so as to fill the solder paste into the openings and to remove the excess solder paste.

8. The solder paste printing apparatus of claim 1, wherein said scraping squeegee is arranged so that a line of contact between said scraping squeegee and the front surface of the mask intersects each side edge of the openings.

9. The solder paste printing apparatus of claim 1, further comprising a filling adjustment device for adjusting a positioning of said filling squeegee so as to vary at least one of a size of the gap and an upward incline angle of said filling pressuring face relative to the front surface.

10. The solder paste printing apparatus of claim 9, further comprising a filling pressure detector for detecting a filling pressure of the solder paste filled into the openings during printing, and a control device for controlling said filling adjustment device based on the filling pressure detected by said filling pressure detector.

11. The solder paste printing apparatus of claim 1, wherein said filling squeegee and said scraping squeegee are interconnected so as to simultaneously move in the printing direction.

12. A solder paste printing apparatus comprising:
a squeegee device operable to move in a printing direction across a front surface of a mask having openings formed therein so as to apply solder paste on the front surface of the mask onto a face of a circuit board positioned at a rear surface of the mask via the openings in the mask, said squeegee device including:
- a filling squeegee having a tip end and a filling pressuring face extending from said tip end in the printing direction at an upward incline relative to the front surface of the mask, said filling pressuring face being arranged so as to oppose the front surface of the mask to thereby press the solder paste against the front surface and fill the solder paste into the openings in the mask as said squeegee device moves across the front surface, said filling squeegee being shaped and arranged so as to form a gap between said tip end and the front surface of the mask such that said filling squeegee does not contact the front surface of the mask as said squeegee device moves across the front surface: and
- a scraping squeegee arranged behind said filling squeegee with respect to the printing direction, said scraping squeegee being arranged and operable to move in the printing direction while contacting the front surface during printing so as to remove excess solder paste from the front surface;

a filling adjustment device for adjusting a positioning of said filling squeegee so as to vary at least one of a size of the gap and an upward incline angle of said filling pressuring face relative to the front surface; and a filling pressure detector for detecting a filling pressure of the solder paste filled into the openings during printing, and a control device for controlling said filling adjustment device based on the filling pressure detected by said filling pressure detector, wherein said filling pressure detector comprises a reaction force detector for detecting a reaction force, the reaction force being a sum of filling pressures of the solder paste acting against an entirety of said filling pressuring face during printing.

13. A solder paste printing apparatus comprising:

a squeegee device operable to move in a printing direction across a front surface of a mask having openings formed therein so as to apply solder paste on the front surface of the mask onto a face of a circuit board positioned at a rear surface of the mask via the openings in the mask, said squeegee device including:
- a filling squeegee having a tip end and a filling pressuring face extending from said tip end in the printing direction at an upward incline relative to the front surface of the mask, said filling pressuring face being arranged so as to oppose the front surface of the mask to thereby cress the solder paste against the front surface and fill the solder paste into the openings in the mask as said squeegee device moves across the front surface, said filling squeegee being shaped and arranged so as to form a gap between said tip end and the front surface of the mask such that said filling squeegee does not contact the front surface of the mask as said squeegee device moves across the front surface; and
- a scraping squeegee arranged behind said filling squeegee with respect to the printing direction, said scraping squeegee being arranged and operable to move in the printing direction while contacting the front surface during printing so as to remove excess solder paste from the front surface;

a filling adjustment device for adjusting a positioning of said filling squeegee so as to vary at least one of a size of the gap and an upward incline angle of said filling pressuring face relative to the front surface; and a filling pressure detector for detecting a filling pressure of the solder caste filled into the openings during printing, and a control device for controlling said filling adjustment device based on the filling pressure detected by said filling pressure detector, wherein said filling pressure, detector comprises a pressure detector located at said filling pressuring face for directly detecting the filling pressure of the solder paste.

14. A solder paste printing apparatus comprising:

a squeegee device operable to move in a printing direction across a front surface of a mask having openings formed therein so as to apply solder paste on the front surface of the mask onto a face of a circuit board positioned at a rear surface of the mask via the openings in the mask, said squeegee device including:
- a filling squeegee having a tip end and a filling pressuring face extending from said tin end in the printing direction at an upward incline relative to the front surface of the mask, said filling pressuring face being arranged so as to oppose the front surface of the mask to thereby press the solder paste against the front surface and fill the solder paste into the openings in the mask as said squeegee device moves across the front surface, said filling squeegee being shaped and arranged so as to form a gap between said tip end and the front surface of the mask such that said filling squeegee does not contact the front surface of the mask as said squeegee device moves across the front surface, wherein said filling pressuring face has a flat surface; and
- a scraping squeegee arranged behind said filling squeegee with respect to the printing direction, said scraping squeegee being arranged and operable to move in the printing direction while contacting the front surface during printing so as to remove excess solder paste from the front surface.

15. A solder paste printing apparatus comprising:

a squeegee device operable to move in a printing direction across a front surface of a mask having openings formed therein so as to apply solder paste on the front surface of the mask onto a face of a circuit board positioned at a rear surface of the mask via the openings in the mask, said squeegee device including:
- a filling squeegee having a tip end and a filling pressuring face extending from said tip end in the printing direction at an upward incline relative to the front surface of the mask, said filling pressuring face being arranged so as to oppose the front surface of the mask to thereby cress the solder paste against the front surface and fill the solder paste into the openings in the mask as said squeegee device moves across the front surface, said filling squeegee being shaped and arranged so as to form a gap between said tip end and the front surface of the mask such that said filling squeegee does not contact the front surface of the mask as said squeegee device moves across the front surface, wherein said filling pressuring face has a non-flat, curved surface; and
- a scraping squeegee arranged behind said filling squeegee with respect to the printing direction, said scraping squeegee being arranged and operable to move in the printing direction while contacting the front surface during printing so as to remove excess solder paste from the front surface.

* * * * *

UNITED STATES PATENT AND TRADEMARK OFFICE
CERTIFICATE OF CORRECTION

PATENT NO. : 6,814,804 B2
DATED : November 9, 2004
INVENTOR(S) : Hiroaki Onishi et al.

It is certified that error appears in the above-identified patent and that said Letters Patent is hereby corrected as shown below:

Column 18,
Line 6, replace "pressure, detector" with -- pressure detector --.
Line 49, replace "cress" with -- press --.

Signed and Sealed this

Third Day of May, 2005

JON W. DUDAS
*Director of the United States Patent and Trademark Office*